(12) United States Patent
Matsumoto et al.

(10) Patent No.: US 11,699,608 B2
(45) Date of Patent: Jul. 11, 2023

(54) SUBSTRATE STORAGE APPARATUS, SUBSTRATE STORAGE METHOD, AND RECORDING MEDIUM

(71) Applicant: Tokyo Electron Limited, Tokyo (JP)

(72) Inventors: Akihiro Matsumoto, Kumamoto (JP); Michiaki Matsushita, Kumamoto (JP); Akira Murata, Kumamoto (JP); Minoru Tashiro, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 861 days.

(21) Appl. No.: 16/487,533

(22) PCT Filed: Feb. 15, 2018

(86) PCT No.: PCT/JP2018/005346
§ 371 (c)(1),
(2) Date: Aug. 21, 2019

(87) PCT Pub. No.: WO2018/155312
PCT Pub. Date: Aug. 30, 2018

(65) Prior Publication Data
US 2020/0058531 A1    Feb. 20, 2020

(30) Foreign Application Priority Data
Feb. 22, 2017 (JP) .................. 2017-031476

(51) Int. Cl.
*H01L 21/673* (2006.01)
*B65G 49/05* (2006.01)
*H01L 21/677* (2006.01)

(52) U.S. Cl.
CPC ........ *H01L 21/67386* (2013.01); *B65G 49/05* (2013.01); *H01L 21/67373* (2013.01); *H01L 21/67393* (2013.01); *H01L 21/67772* (2013.01)

(58) Field of Classification Search
CPC combination set(s) only.
See application file for complete search history.

(56) References Cited

U.S. PATENT DOCUMENTS 9,318,363 B2 * 4/2016 Kai ................... H01L 21/67772
2014/0199140 A1 * 7/2014 Matsumoto ....... H01L 21/67772
                                                                   414/222.07

FOREIGN PATENT DOCUMENTS

| CN | 103928377 A | 7/2014 |
| JP | 2001-077177 A | 3/2001 |

(Continued)

OTHER PUBLICATIONS

International Search Report dated Mar. 27, 2018 for WO 2018/155312 A1.

*Primary Examiner* — Saul Rodriguez
*Assistant Examiner* — Willie W Berry, Jr.
(74) *Attorney, Agent, or Firm* — Venjuris, P.C.

(57) ABSTRACT

A substrate storage apparatus includes a stage on which a cassette that has a lid detachably mounted to an opening is disposed, a lid attaching/detaching plate that performs attaching/detaching of the lid to/from the opening of the cassette disposed on the stage, and is provided to be movable between a mounting position in contact with the lid disposed at a position of the opening and a retracted position not in contact with the lid disposed at the position of the opening, a lid holding sensor that detects whether the lid is being held by the lid attaching/detaching plate, and a controller that determines presence/absence of abnormality related to (Continued)

attachment/detachment of the lid based on a detection result of the lid holding sensor.

8 Claims, 18 Drawing Sheets

(56) References Cited

FOREIGN PATENT DOCUMENTS

| | | |
|---|---|---|
| JP | 2001-358197 A | 12/2001 |
| JP | 2014-138011 A | 7/2014 |

* cited by examiner

SUBSTRATE STORAGE APPARATUS, SUBSTRATE STORAGE METHOD, AND RECORDING MEDIUM

CROSS REFERENCE TO RELATED APPLICATIONS

This application is a national phase of PCT application No. PCT/JP2018/005346, filed on Feb. 15, 2018, which claims priority from Japanese Patent Application No. 2017-031476, filed on Feb. 22, 2017, all of which are incorporated herein in their entireties by reference.

TECHNICAL FIELD

The present disclosure relates to a substrate storage apparatus, a substrate storage method, and a recording medium, in which a cassette for storing substrates is properly transported.

BACKGROUND

In a processing system where substrates such as semiconductor wafers are processed by using a cassette called FOUP (front opening unified pod) having a high sealing performance, it is possible to improve maintaining the sealing performance and safety at the time of substrate transportation. An opening through which the substrates are inserted/removed is formed in a cassette body of the FOUP. A lid that may be locked by a latch mechanism is detachably mounted to the opening (see, e.g., Patent Document 1).

In the above processing system, a cassette in a state where the opening is closed by a lid is placed on a stage. Then, the opening is open when the lid of the cassette is unlocked by a lid attaching/detaching mechanism having a key. Then, in a state where the opening is open, substrates are taken out of the cassette, and the processing of the substrates is performed. The processed substrates are stored in the cassette again, and then, the opening of the cassette is closed and locked again by the lid by the lid attaching/detaching mechanism. The cassette sealed through a series of processings discussed above is carried out of the stage in a state where the processed substrates are stored.

In the above described processing system, when the lid is neither properly mounted nor locked to the cassette body storing substrates, there is a concern that the substrates may pop out of the cassette and fall off at the subsequent cassette transportation.

The mounting and locking of the lid to the cassette body may not be properly performed due to various factors. For example, in some cases, the lid, that is locked at a position where the opening of the cassette body is closed and then needs to be separated from the lid attaching/detaching mechanism, may not be separated from the lid attaching/detaching mechanism, and may be moved to a retracted position together with the lid attaching/detaching mechanism due to, for example, a failure of a locking mechanism provided in the cassette. In this case, the opening of the cassette body, which is closed by the lid at a normal state, is placed in an open state. Thus, there is a possibility that substrates may pop out at the subsequent cassette transportation.

PRIOR ART DOCUMENT

Patent Document

Patent Document 1: Japanese Patent Laid-Open Publication No. 2001-358197

SUMMARY OF THE INVENTION

Problem to be Solved

The present disclosure has been made in view of the above described circumstances, and an object thereof is to provide a substrate storage apparatus, a substrate storage method, and a recording medium, in which it is possible to check whether a lid is properly mounted to a cassette configured to store substrates.

Means to Solve the Problem

An aspect of the present disclosure relates to a substrate storage apparatus including: a stage on which a cassette storing substrates is disposed, the cassette having an opening and a lid detachably mounted to the opening; a lid attaching/detaching plate that performs attaching/detaching of the lid to/from the opening of the cassette disposed on the stage, the lid attaching/detaching plate being provided to be movable between a mounting position in contact with the lid disposed at a position of the opening, and a retracted position not in contact with the lid disposed at the position of the opening; a lid holding sensor that detects whether the lid is held by the lid attaching/detaching plate; and a controller that determines presence/absence of abnormality related to attachment/detachment of the lid based on a detection result of the lid holding sensor.

Another aspect of the present disclosure relates to a substrate storage method of determining presence/absence of abnormality related to attachment/detachment of a lid in a substrate storage apparatus that includes: a stage on which a cassette storing substrates is disposed, the cassette having an opening and the lid detachably mounted to the opening; and a lid attaching/detaching plate that performs attaching/detaching of the lid to/from the opening of the cassette disposed on the stage, the lid attaching/detaching plate being provided to be movable between a mounting position in contact with the lid disposed at a position of the opening, and a retracted position not in contact with the lid disposed at the position of the opening, the substrate storage method including: detecting whether the lid is being held by the lid attaching/detaching plate, by a lid holding sensor; and determining the presence/absence of the abnormality related to the attachment/detachment of the lid based on a detection result of the lid holding sensor.

A further aspect of the present disclosure relates to a computer readable recording medium having recorded therein a program for executing the above substrate storage method, which includes detecting whether the lid is held by the lid attaching/detaching plate, by the lid holding sensor, and a procedure of determining the presence/absence of the abnormality related to the attachment/detachment of the lid based on the detection result of the lid holding sensor.

Effect of the Invention

According to the present disclosure, it is possible to check whether a lid is properly mounted to a cassette configured to store substrates.

DETAILED DESCRIPTION TO EXECUTE THE INVENTION

Hereinafter, embodiments of the present disclosure will be described with reference to accompanying drawings.

The present disclosure is applicable to the entire system in which a lid may be detachably mounted to an opening of a cassette that stores substrates. In the following embodiments, as an example, descriptions will be made on a case in which the present disclosure is applied to a processing system that performs loading of a cassette storing a plurality of unprocessed substrates, processing of the substrates taken out of the cassette, re-storing of the processed substrates in the cassette, and unloading of the cassette storing the plurality of processed substrates.

Figure 1:
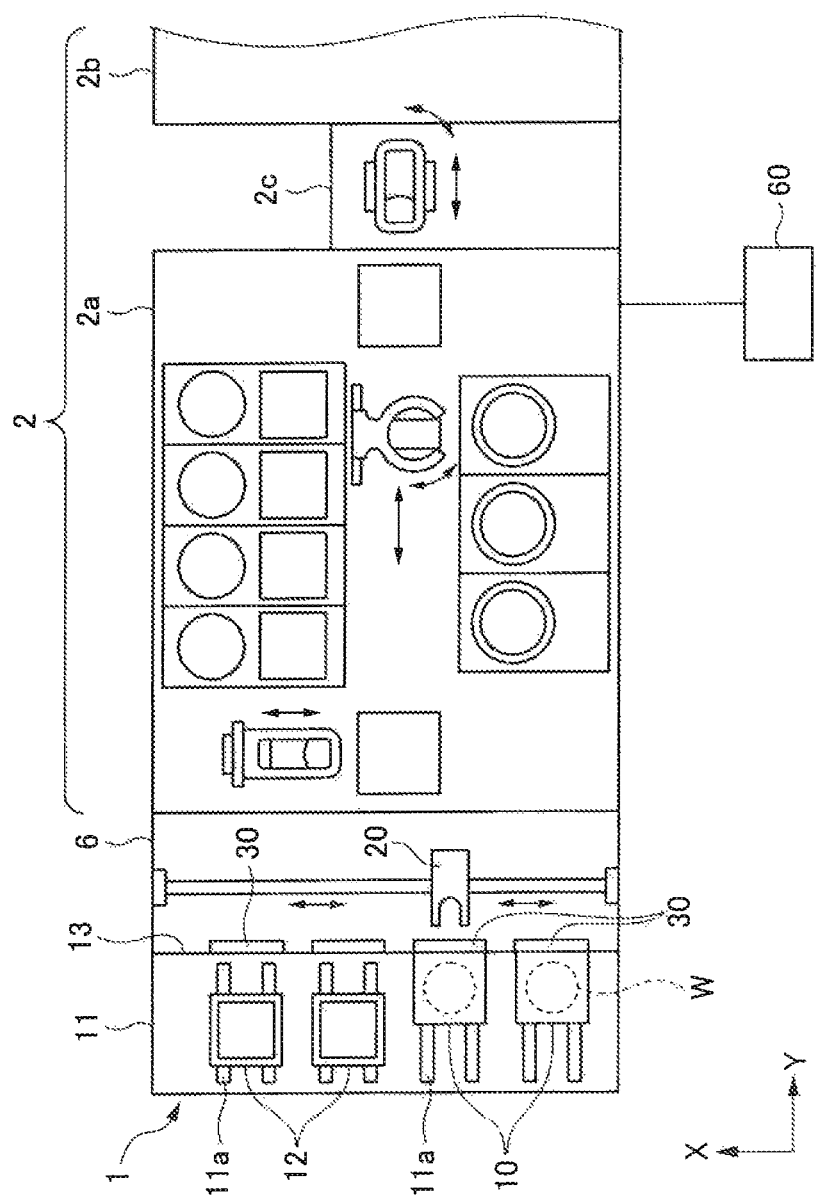
FIG. 1 is a schematic plan view illustrating an example of a processing system according to an embodiment of the present disclosure.
Figure 2:
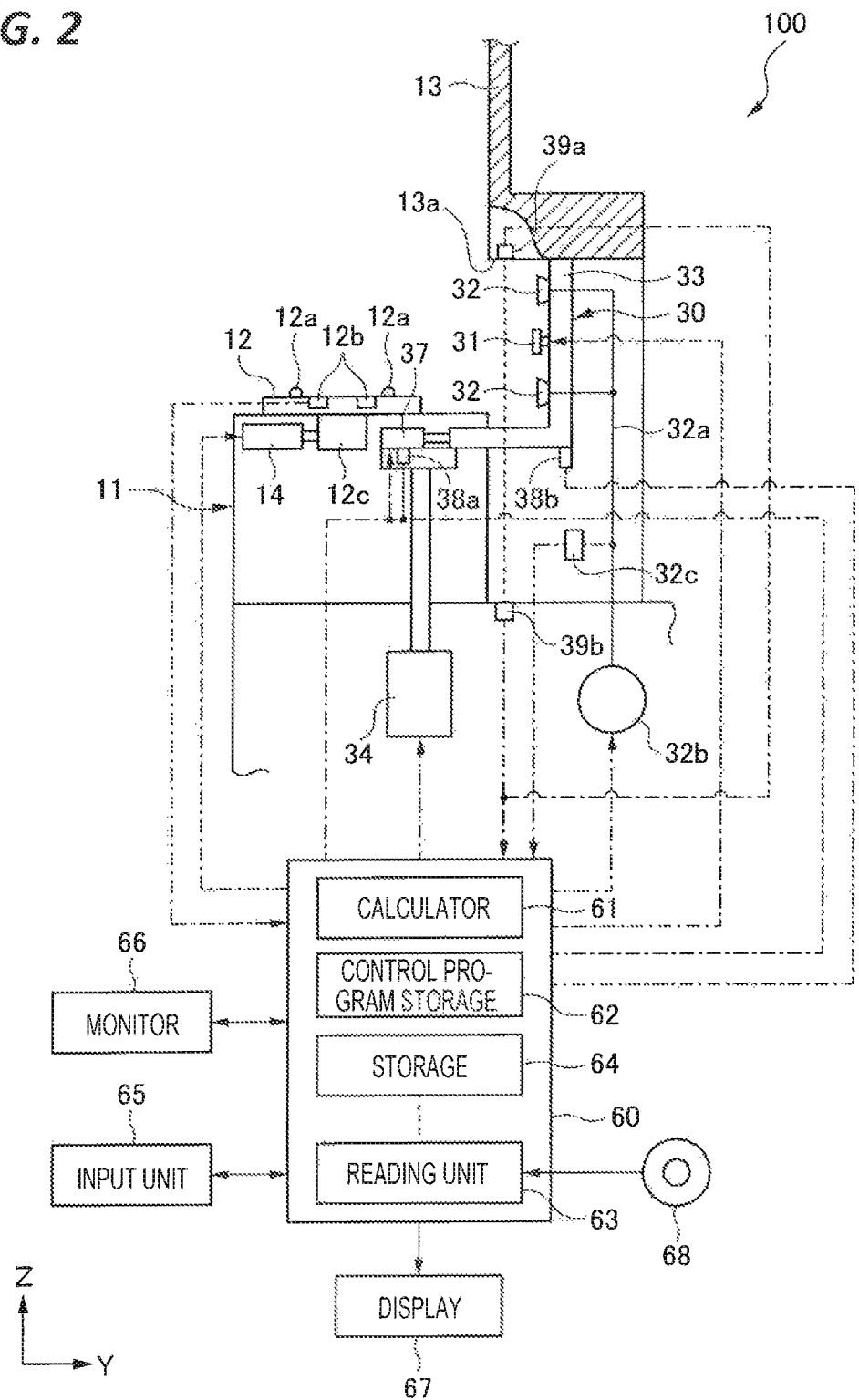
FIG. 2 is a schematic configuration view illustrating a main part of a substrate storage apparatus provided in the processing system in FIG. 1.

FIG. 1 is a schematic plan view illustrating an example of a processing system according to an embodiment of the present disclosure. FIG. 2 is a schematic configuration view illustrating a main part ofa substrate storage apparatus 100 provided in the processing system in FIG. 1.

The processing system illustrated in FIG. 1 includes a cassette station 1 where a cassette 10 storing a plurality of (e.g., 25) semiconductor wafers W (hereinafter, referred to as wafers W) is disposed, and a processing unit 2 where the wafers W taken out of the cassette station 1 are processed.

The processing unit 2 illustrated in FIG. 1 includes a first processor 2a that performs a processing such as resist coating and development processing, a second processor 2b that performs immersion exposure on the surface of the wafer W in a state where a light-transmitting liquid layer is formed on the surface of the wafer W, and an interface unit 2c that performs delivery of the wafer W between the first processor 2a and the second processor 2b. Meanwhile, a specific configuration of the processing unit 2 is not particularly limited, and the processing unit 2 may perform any processing on the wafer W.

The cassette station 1 includes a stage 11, a partition wall 13, and a substrate transportation mechanism 20.

A plurality of (e.g., four) cassette stages 12 is provided in the stage 11, and the cassette 10 is placed on each of the cassette stages 12. The cassette 10 disposed on the cassette stage 12 is detachably clamped by a clamping mechanism (not illustrated). The partition wall 13 separates the stage 11 from a placement section 6 of the substrate transportation mechanism 20, and has an opening 13a larger than an opening 10b of the cassette 10. The openings 13a corresponding to the number of the cassette stages 12 are formed, and are provided at positions corresponding to the openings 10b of the cassettes 10 on the cassette stages 12 disposed at a docking position. The substrate transportation mechanism 20 unloads wafers W from the cassettes 10 disposed on the cassette stages 12, and loads processed wafers W to the cassettes 10 disposed on the cassette stages 12. Loading and unloading of the wafers W to/from the cassettes 10 are performed through the openings 10b formed in the cassettes 10 and the openings 13a formed in the partition wall 13.

The cassette stage 12 has a movable base 12c that is provided to be slidable along a guide rail 11a that is laid on the stage 11 and extends in the Y-axis direction, and is provided to be movable in the Y-axis direction by a movement mechanism 14 coupled to the movable base 12c. Each cassette stage 12 is capable of advancing/retracting along the guide rail 11a between a docking position where the cassette 10 is allowed to abut on the partition wall 13, and an undocking position where retraction from the partition wall 13 is made.

As illustrated in FIG. 2, positioning pins 12a are provided at the center of the top surface of the cassette stage 12, and sensors 12b are disposed in the vicinity of the positioning pins 12a. When the cassette 10 is placed on the cassette stage 12, the positioning pins 12a are fitted to recesses (not illustrated) of the bottom portion of the cassette 10 so as to position the cassette 10. When the cassette 10 is placed on the cassette stage 12, the sensors 12b detect the cassette 10, and send detection signals to a controller 60.

Figure 3:
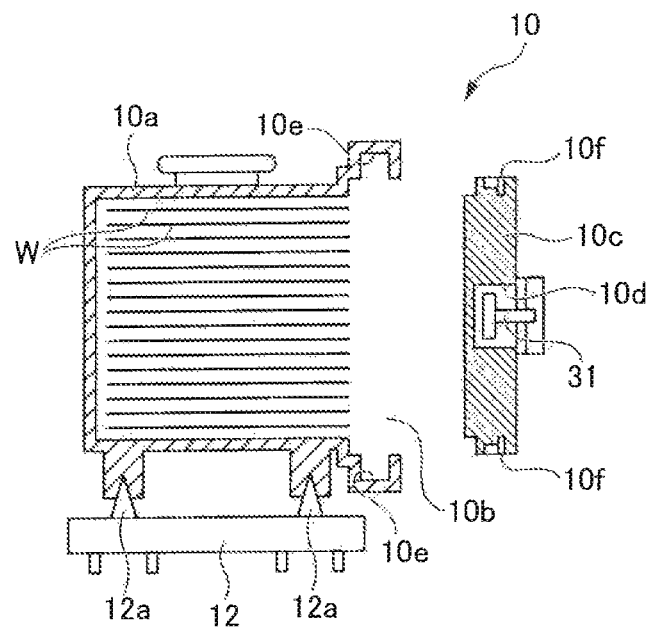
FIG. 3 is a sectional view illustrating a state where an opening of a cassette is not closed by a lid.
Figure 4:
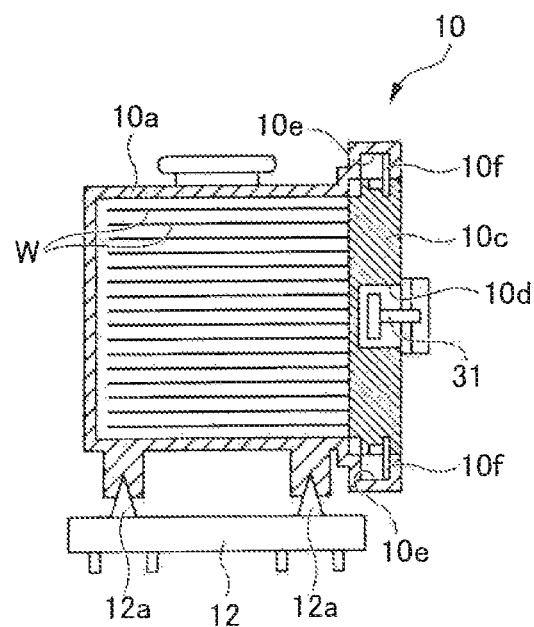
FIG. 4 is a sectional view illustrating a state where the opening of the cassette is closed by the lid.
Figure 5:
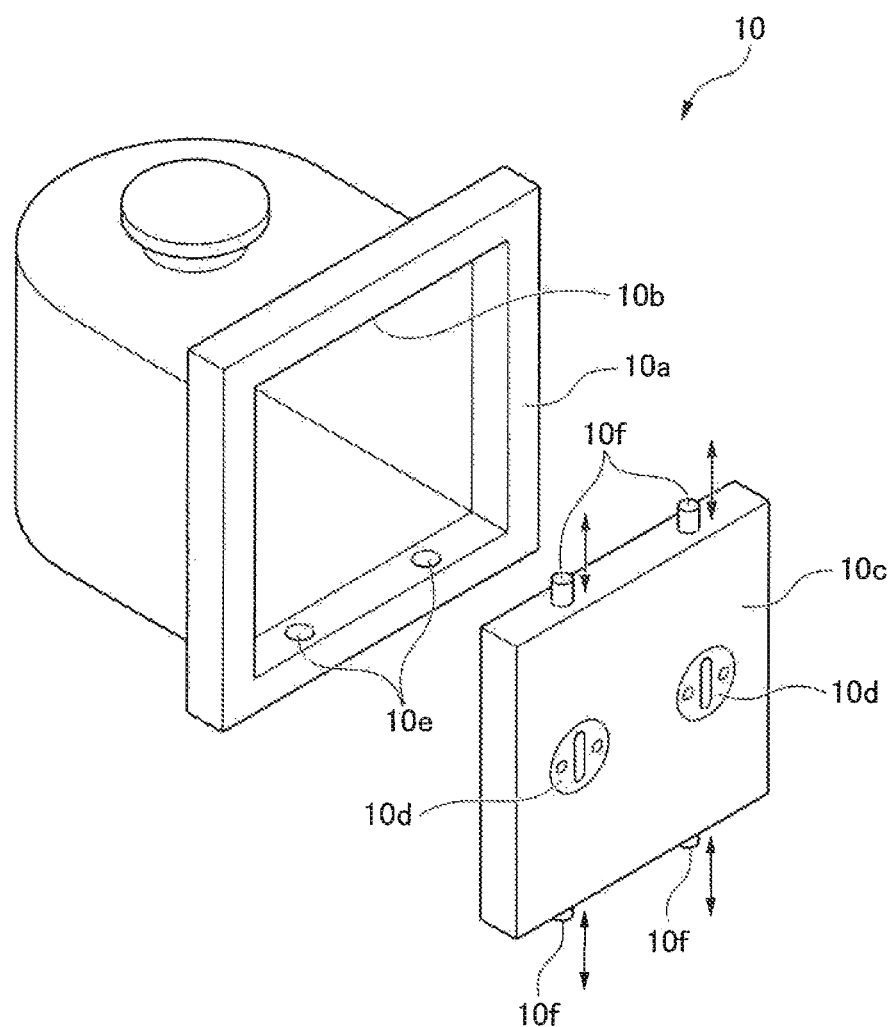
FIG. 5 is a schematic perspective view of the cassette.

FIG. 3 is a sectional view illustrating a state where the opening 10b of the cassette 10 is not closed by a lid 10c. FIG. 4 is a sectional view illustrating a state where the opening 10b of the cassette 10 is closed by the lid 10c. FIG. 5 is a schematic perspective view of the cassette 10.

The cassette 10 includes a cassette body 10a capable of storing a plurality of (e.g., 25) wafers W, the opening 10b through which the wafers W pass when the wafers W are loaded/unloaded to/from the cassette body 10a, and the lid 10c detachably mounted to the opening 10b. Key holes 10d are formed at two left and right places of the surface portion of the lid 10c. Latches 10f are provided to be able to protrude/retract at two left and right places (four places in total) of upper/lower end portions of the lid 10c. Locking of the lid 10c is performed when these latches 10f are fitted to locking holes 10e provided at two left and right places (four places in total) of inner side surfaces (particularly, upper and lower surfaces) in the opening 10b of the cassette body 10a.

That is, key portions 31 are engaged with the key holes 10d, and the latches 10f are disposed at locking positions and unlocking positions by the key portions 31 engaged with the key holes 10d. More specifically, when the key portions 31 engaged with the key holes 10d are rotated by 90 degrees, the latches 10f located inside the lid 10c protrude upwards and downwards at once, and the latches 10f are fitted to the locking holes 10e. Therefore, in the lid 10c removed from the opening 10b (see FIG. 3), the latches 10f are basically located inside the lid 10c. Meanwhile, in a state where the lid 10c is attached to the opening 10b (see FIG. 4), and the key portions 31 are engaged with the key holes 10d, when the key portions 31 are rotated by 90 degrees, the latches 10f protrude in the vertical direction of the lid 10c and are fitted to the locking holes 10e, and then the lid 10c is locked to the opening 10b.

Next, descriptions will be made on a lid attaching/detaching mechanism 30 that performs attaching/detaching of the lid 10c to/from the opening 10b of the cassette 10 disposed on the cassette stage 12 in the stage 11.

Figure 6:
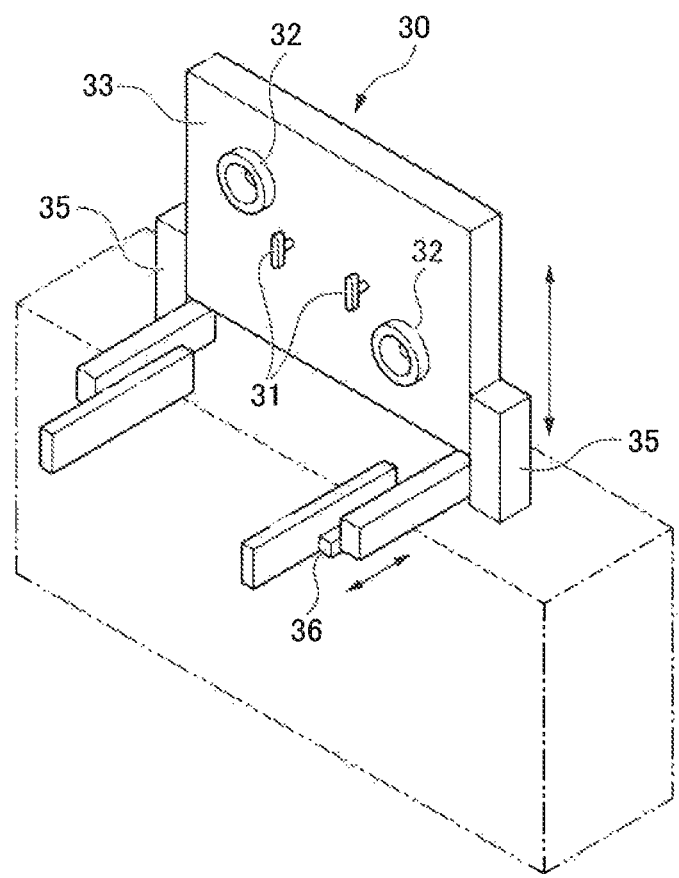
FIG. 6 is a schematic perspective view of a lid attaching/detaching mechanism.

FIG. 6 is a schematic perspective view of the lid attaching/detaching mechanism 30. When the lid 10c is removed from the opening 10b, the lid attaching/detaching mechanism 30 causes the key portions 31 engaged with the key holes 10d to dispose the latches 10f at the unlocking positions, and causes adsorption holding portions 32 to hold the lid 10c. Meanwhile, when the lid 10c is attached to the opening 10b, the lid attaching/detaching mechanism 30 disposes the latches 10f at the locking positions by the key portions 31 engaged with the key holes 10d in a state where the lid 10c is disposed at the position of the opening 10b.

More specifically, as illustrated in FIG. 2 and FIG. 6, the lid attaching/detaching mechanism 30 includes a shutter plate 33. On the surface portion of the shutter plate 33, the key portions 31 are formed to protrude at two left and right places, and the pad-type adsorption holding portions 32 are provided at two places. The shutter plate 33 is supported by support members 35, and the support members 35 are provided to be able to move up and down by an elevating mechanism 34 (see FIG. 2). The shutter plate 33 is moved by a Y-axis drive mechanism 37 (see FIG. 2), in the attachment and detachment direction (that is, the Y-axis direction) of the lid 10c through a linear guide 36. Specifically, the lid attaching/detaching mechanism 30 is provided to be able to move to a mounting position in contact with the lid 10c disposed at the position of the opening 10b, and a retracted position not in contact with the lid 10c disposed at the position of the opening 10b.

The adsorption holding portions 32 are holding units configured to hold the lid 10c by adsorption. As illustrated in FIG. 2, the adsorption holding portions 32 are connected to a vacuum pump 32b as a negative pressure unit that generates a negative pressure for adsorption, via a pipe 32a, so as to hold the lid 10c by suction. A pressure sensor 32c is provided in the pipe 32a to measure a suction pressure of the adsorption holding portions 32, and the measurement result of the pressure sensor 32c is transmitted to the controller 60. In this manner, the pressure sensor 32c functions as a suction pressure sensor that measures a suction pressure acting on the lid 10c when the adsorption holding portions 32 hold the lid 10c.

As illustrated in FIG. 2, a close sensor 38a and an open sensor 38b are provided in the lid attaching/detaching mechanism 30. The close sensor 38a is provided at a position where the lid attaching/detaching mechanism 30 may be detected in a state where the lid 10c held by the adsorption holding portions 32 by adsorption is disposed at the position of the opening 10b of the cassette 10. The open sensor 38b is provided at a position where the lid attaching/ detaching mechanism 30 disposed at the mounting position is not detected but the lid attaching/detaching mechanism 30 disposed at the retracted position may be detected. Detection signals of the close sensor 38a and the open sensor 38b are sent to the controller 60.

Also, as illustrated in FIG. 2, abnormality detection sensors 39a and 39b are provided at upper and lower edges of the opening 13a of the partition wall 13. The abnormality detection sensors 39a and 39b are not only capable of detecting wafers W in a protruding state from the cassette 10, but also capable of detecting the lid 10c protruding from the opening 10b so as to detect whether the wafers W and the lid 10c are properly disposed. For example, in a state where the opening 10b is covered with the lid 10c, when the lid attaching/detaching mechanism 30 is retracted until detected by the open sensor 38b, in some cases, the lid 10c may be inclined and the opening 10b may be placed in a half-open state. In this case, the inclined lid 10c is detected by the abnormality detection sensors 39a and 39b, so that it may be detected that the lid 10c is placed in an abnormal state. In this manner, according to detection results of the abnormality detection sensors 39a and 39b, it is possible to check whether the lid 10c is properly disposed. Also, detection signals of the abnormality detection sensors 39a and 39b are sent to the controller 60.

The movement mechanism 14, the locking operation and the unlocking operation of the key portions 31, the elevating mechanism 34, the Y-axis drive mechanism 37, and the vacuum pump 32b, as described above, are driven/controlled by the controller 60.

The controller 60 includes not only a calculator 61, but also a control program storage 62 that stores programs and data for executing each processing step, a reading unit 63, and a storage 64. The controller 60 includes a display 67 that notifies about an abnormal state based on the detection signals of various sensors, and a recording medium 68 inserted in the reading unit 63, which is a computer readable recording medium 68 that stores software causing the controller 60 to execute a control program. The controller 60 is connected to an input unit 65 and a monitor 66 that displays a processing step screen. The controller 60 having the above described configuration outputs control signals to the above respective units based on the control program.

Also, the calculator 61 may be realized by a combination of hardware and software. For example, a general-purpose computer may be used as hardware, and a program for operating the above general purpose computer may be used as software. The software may be stored in any recording medium 68 (that is, a non-transitory computer readable recording medium) readable by the hardware. That is, the software may be stored in the recording medium 68 fixedly provided in the computer, such as a hard disk drive, or the software may be stored in the recording medium 68 detachably set in the computer, such as a compact disk, a flash memory, a flexible disk, or a memory card. The control program stored in the recording medium 68 is installed to the controller 60 and then is used. Therefore, in the recording medium 68, a program that causes the computer to execute each procedure performed in a substrate storage method to be described below may be recorded.

<Substrate Storage Apparatus and Substrate Storage Method>

In a processing system having the above described configuration, the substrate storage apparatus 100 including a lid holding sensor and an abnormality determination unit is provided. The lid holding sensor may be constituted by various sensors, and directly or indirectly detects whether the lid 10c is being held by the lid attaching/detaching mechanism 30. The abnormality determination unit is constituted by the controller 60, and determines the presence/absence of abnormality related to attachment/detachment of the lid 10c based on a detection result of the lid holding sensor (that is, lid attachment/detachment abnormality determination). Hereinafter, descriptions will be made on representative embodiments of such a substrate storage apparatus 100.

First Embodiment

In the present embodiment, the pressure sensor 32c functions as a lid holding sensor. That is, the controller 60 (that is, an abnormality determination unit) determines a lid attachment/detachment abnormality related to attachment/detachment of the lid 10c based on the measurement result of the pressure sensor 32c.

Figure 7A:
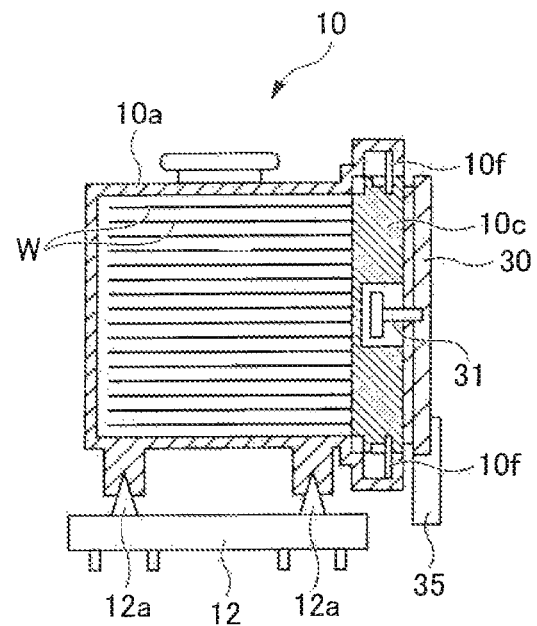
FIG. 7A is a sectional view simply illustrating the cassette and the lid attaching/detaching mechanism in a normal state in lid attachment/detachment abnormality determination, which illustrates a state where the lid attaching/detaching mechanism is disposed at a mounting position.
Figure 7B:
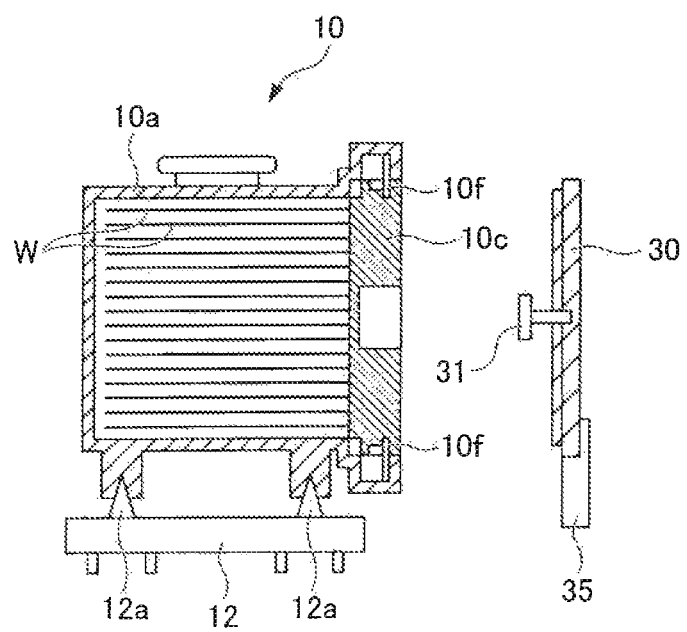
FIG. 7B is a sectional view simply illustrating the cassette and the lid attaching/detaching mechanism in a normal state in lid attachment/detachment abnormality determination, which illustrates a state where the lid attaching/detaching mechanism is disposed at a retracted position.
Figure 8A:
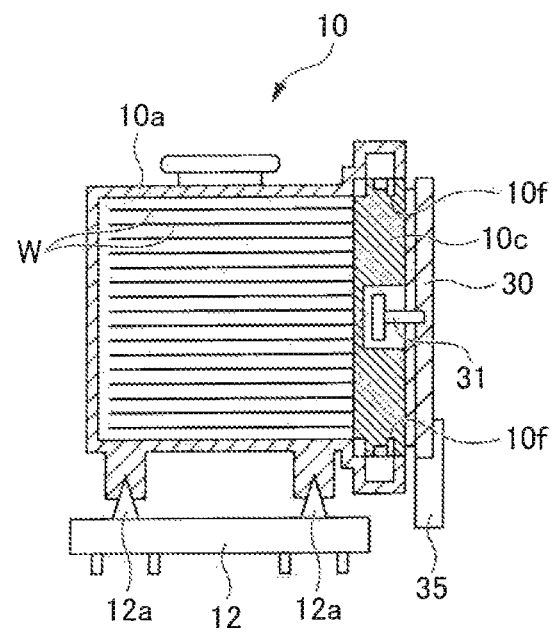
FIG. 8A is a sectional view simply illustrating the cassette and the lid attaching/detaching mechanism in an abnormal state in lid attachment/detachment abnormality determination, which illustrates a state where the lid attaching/detaching mechanism is disposed at a mounting position.
Figure 8B:
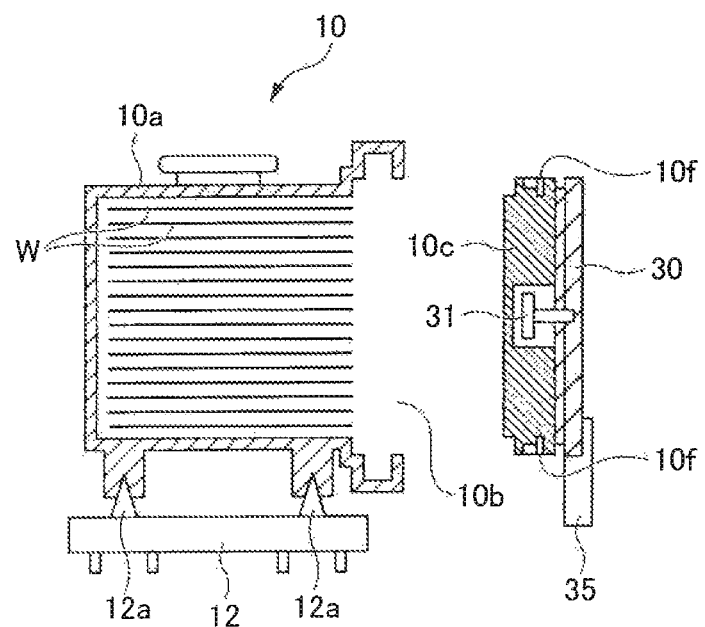
FIG. 8B is a sectional view simply illustrating the cassette and the lid attaching/detaching mechanism in an abnormal state in lid attachment/detachment abnormality determination, which illustrates a state where the lid attaching/detaching mechanism is disposed at a retracted position.

FIG. 7A and FIG. 7B are sectional views simply illustrating the cassette 10 and the lid attaching/detaching mechanism 30 in a normal state in lid attachment/detachment abnormality determination. FIG. 7A illustrates a state where the lid attaching/detaching mechanism 30 is disposed at the mounting position, and FIG. 7B illustrates a state where the lid attaching/detaching mechanism 30 is disposed at the retracted position. FIG. 8A and FIG. 8B are sectional views simply illustrating the cassette 10 and the lid attaching/detaching mechanism 30 in an abnormal state in lid attachment/detachment abnormality determination. FIG. 8A illustrates a state where the lid attaching/detaching mechanism 30 is disposed at the mounting position, and FIG. 8B illustrates a state where the lid attaching/detaching mechanism 30 is disposed at the retracted position.

In a case where the cassette 10 and the lid attaching/detaching mechanism 30 normally operate, after the latches 10f are disposed at the locking positions by the key portions 31, when the lid attaching/detaching mechanism 30 moves from the mounting position (see FIG. 7A) to the retracted position (see FIG. 7B), only the lid attaching/detaching mechanism 30 moves to the retracted position in a state where the lid 10c is mounted to the opening 10b. That is, the lid attaching/detaching mechanism 30 disposed at the retracted position does not hold the lid 10c.

Meanwhile, in a case where there is abnormality in the operation of the cassette 10 and/or the lid attaching/detaching mechanism 30, even when the key portions 31 perform a locking operation to dispose the latches 10f at the locking positions, in some cases, the latches 10f may not be disposed at the locking positions in actuality, and the lid 10c may not be properly attached to the opening 10b. In this case, when the lid attaching/detaching mechanism 30 moves from the mounting position (see FIG. 8A) to the retracted position (see FIG. 8B), in some cases, the lid 10c may move to the retracted position together with the lid attaching/detaching mechanism 30. That is, while holding the lid 10c, the lid attaching/detaching mechanism 30 moves from the mounting position to the retracted position, and is disposed at the retracted position together with the lid 10c.

The above described lid attachment/detachment abnormality determination performed by the controller 60 is determination for detecting an abnormal behavior illustrated in FIG. 8A and FIG. 8B. That is, in a case where in a normal state, only the lid attaching/detaching mechanism 30 has to move to the retracted position in a state where the lid 10c is mounted to the opening 10b, it is detected whether the lid attaching/detaching mechanism 30 is moving to the retracted position together with the lid 10c so as to determine the presence/absence in the lid attachment/detachment abnormality.

In the present embodiment, in a state where the lid attaching/detaching mechanism 30 is disposed at the retracted position, when the vacuum pump 32b is operated and measurement by the pressure sensor 32c is performed, the pressure of the pipe 32a, which indicates a suction pressure caused by the adsorption holding portions 32, is acquired. Then, the controller 60 performs the lid attachment/detachment abnormality determination based on estimation as to "whether the lid attaching/detaching mechanism 30 disposed at the retracted position is holding the lid 10c" derived from the measurement result of the pressure sensor 32c.

Hereinafter, descriptions will be made on an example where in an abnormality determination processing in which first abnormality determination (see S14 in FIG. 9A) and second abnormality determination (see S18 to S20 in FIG. 9A) different from the above described lid attachment/detachment abnormality determination are performed, the above described lid attachment/detachment abnormality determination is also performed. The first abnormality determination is determination on the presence/absence of abnormality related to attachment/detachment of the lid 10c, which is performed based on detection results of the abnormality detection sensors 39a and 39b after the lid attaching/detaching mechanism 30 is moved from the mounting position toward the retracted position in a state where the lid 10c is disposed at the position of the opening 10b and the latches 10f are disposed at the locking positions. The second abnormality determination is determination on the presence/absence of abnormality related to attachment/detachment of the lid 10c, which is performed based on the result of measurement by the pressure sensor 32c performed in a state where the adsorption holding portions 32 execute suction for holding the lid 10c after the lid attaching/detaching mechanism 30 is moved toward the mounting position. Meanwhile, the above described lid attachment/detachment abnormality determination may not be performed together with the first abnormality determination and/or the second abnormality determination, and may be independently performed irrespective of the first abnormality determination and the second abnormality determination.

Figure 9A:
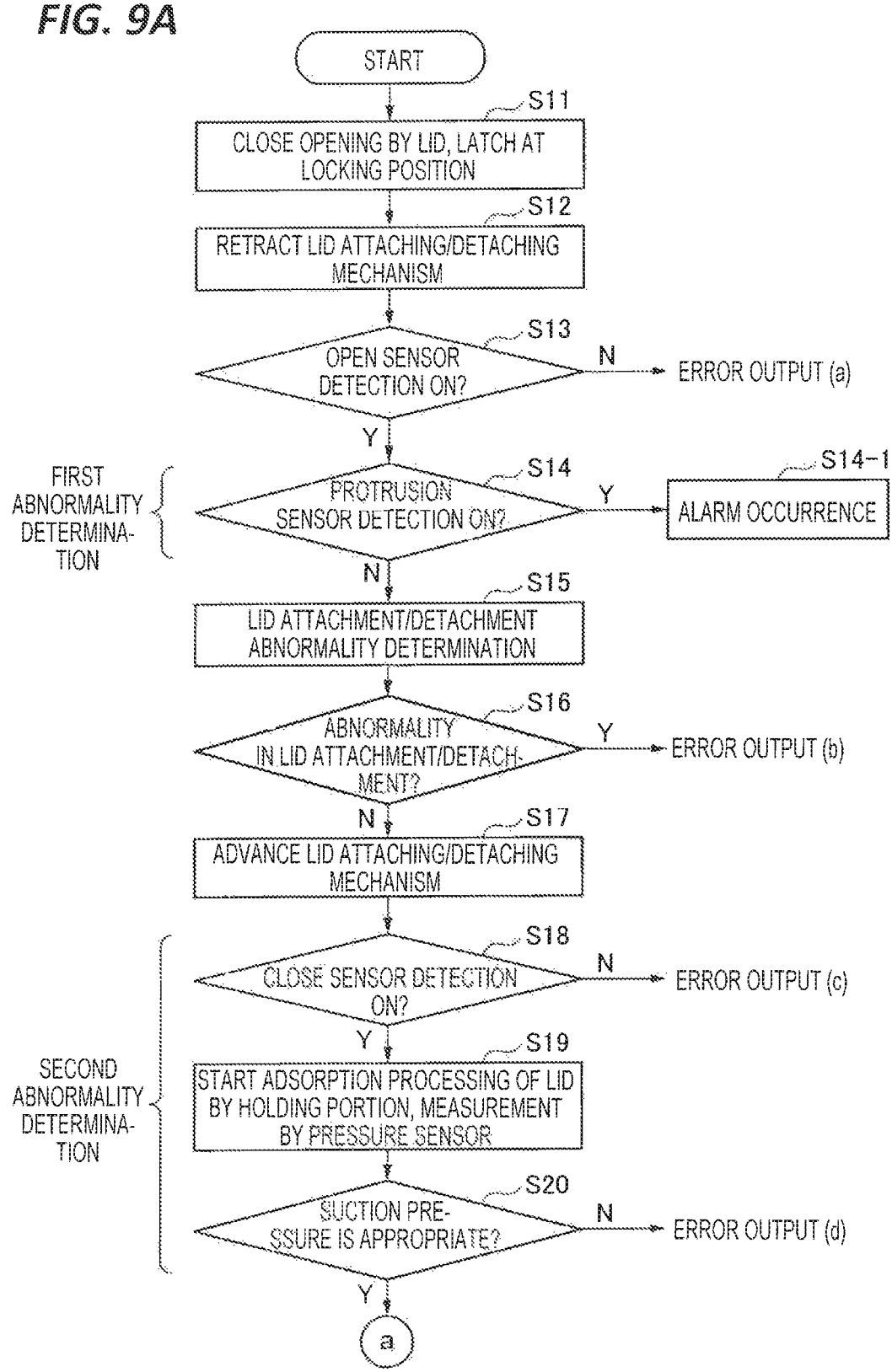
FIG. 9A is a flow chart illustrating a substrate storage method according to a first embodiment.
Figure 9B:
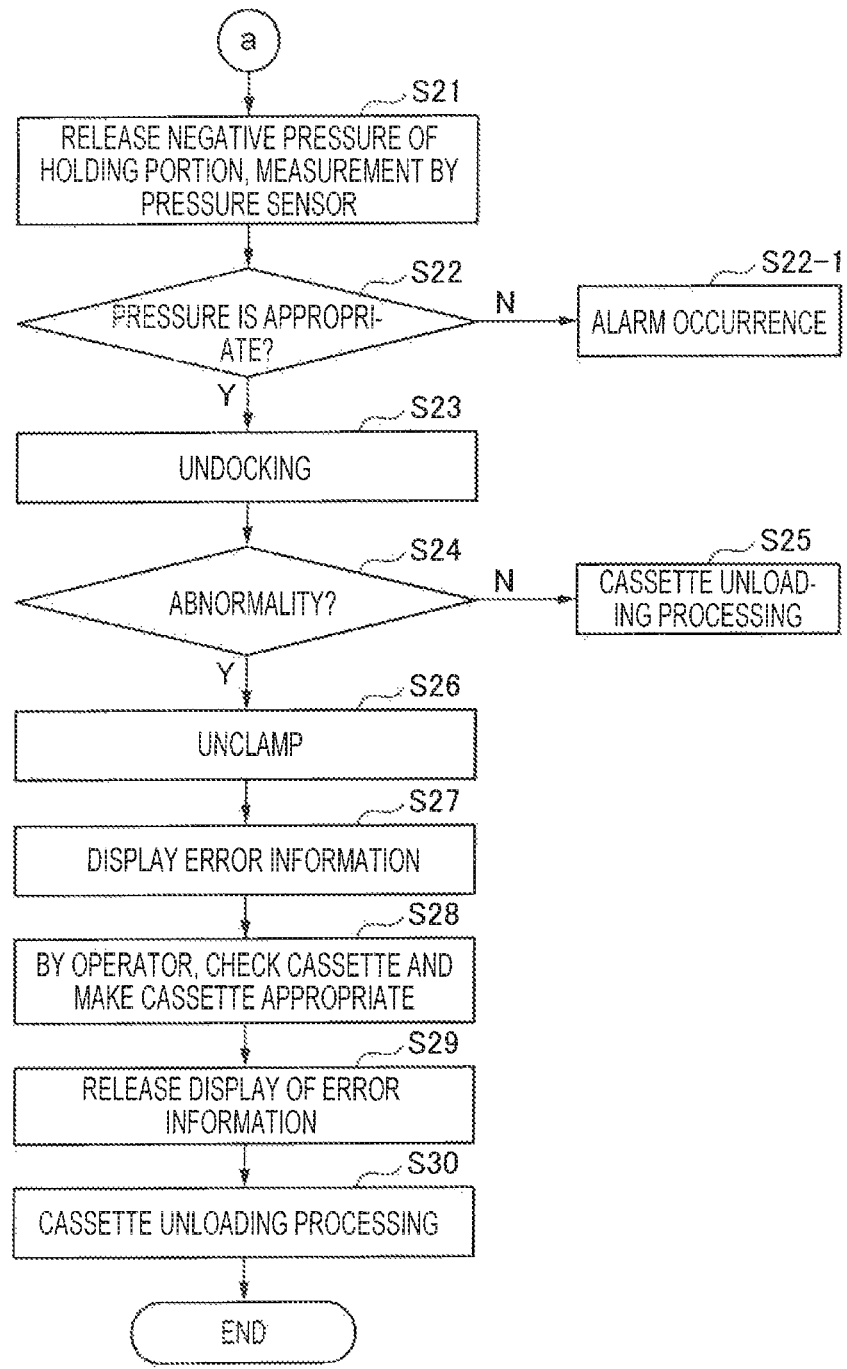
FIG. 9B is a flow chart illustrating the substrate storage method according to the first embodiment.

FIG. 9A and FIG. 9B are flow charts illustrating a substrate storage method according to the first embodiment.

As described above, based on the control signals from the controller 60, processed wafers W are stored in the cassette 10 disposed at the docking position, the lid 10c held by the lid attaching/detaching mechanism 30 is moved to the opening 10b of the cassette 10 so that the opening 10b is closed by the lid 10c, and the lid 10c is locked by the latches 10f (step S11 in FIG. 9A). This state is a state where when the lid attaching/detaching mechanism 30 and/or the stage 11 are/is retracted, the key portions 31 may be pulled out of the key holes 10d.

Next, the lid attaching/detaching mechanism 30 is retracted from the mounting position to the retracted position (S12). Here, the lid 10c is locked by the latches 10f. When there is no interference between the key portions 31 and the key holes 10d, the lid attaching/detaching mechanism 30 moves in a state where the lid 10c is not held.

Then, by the open sensor 38b, it is detected whether the lid attaching/detaching mechanism 30 is disposed at the retracted position. When the lid attaching/detaching mechanism 30 disposed at the retracted position is detected by the open sensor 38b (Y in S13), the process proceeds to the next step S14. Meanwhile, when the lid attaching/detaching mechanism 30 is not detected by the open sensor 38b (N in S13), it is estimated that the lid attaching/detaching mechanism 30 is not disposed at the retracted position. In this case, the controller 60 outputs a signal of an error (a lid attaching/detaching mechanism open error) (see "error output (a)" in FIG. 9A), the storage 64 of the controller 60 stores error information, and the process proceeds to the next step S14.

In step S14, the abnormality detection sensors 39a and 39b detect the presence/absence of abnormality such as pop-out of the lid 10c from the position of the opening 10b or pop-out of the wafers W from the cassette body 10a so as to determine whether the lid is reliably closed in the state of the cassette 10 storing the wafers W (that is, first abnormality determination) (S14). When the abnormality detection sensors 39a and 39b detect nothing (N in S14), it is determined that there is no abnormality, and the process proceeds to the next step S15. Meanwhile, when the abnormality detection sensors 39a and 39b detect an object (Y in S14), it is determined that there is abnormality in the state of the lid 10c. In this case, the controller 60 outputs a signal of a lid attaching/detaching mechanism close error and an alarm occurs (S14-1). Then, an operator is notified of the abnormality. After the operator notified of the abnormality properly stores the wafers W in the cassette body 10a and disposes the lid 10c at an appropriate position, the process proceeds to the next step S15.

In step S15, lid attachment/detachment abnormality determination is performed. In the present embodiment, as described above, the lid attachment/detachment abnormality determination is performed based on the measurement result of the pressure sensor 32c.

Figure 10:
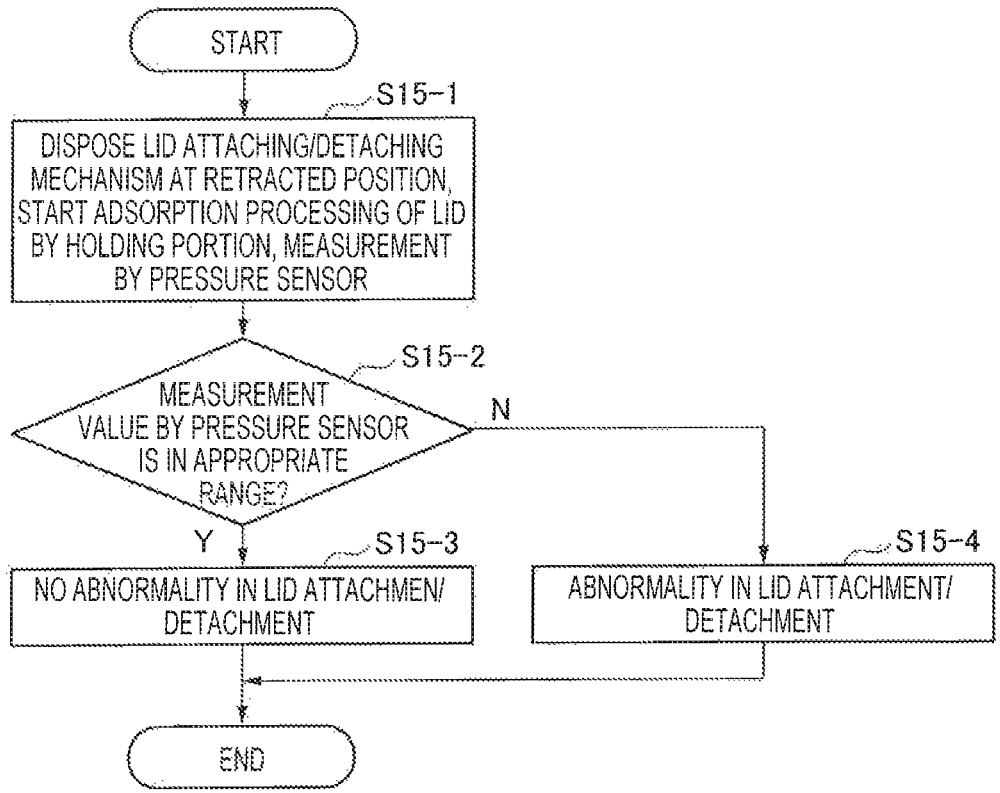
FIG. 10 is a flow chart of a lid attachment/detachment abnormality determination processing according to the first embodiment.

FIG. 10 is a flow chart of a lid attachment/detachment abnormality determination processing according to the first embodiment.

In the lid attachment/detachment abnormality determination processing of the present embodiment, first, in a state where the lid attaching/detaching mechanism 30 is disposed at the retracted position, an adsorption processing of the lid 10c by the adsorption holding portions 32 starts, and the vacuum pump 32b is operated such that the pipe 32a has a negative pressure. In this state, measurement is performed by the pressure sensor 32c, and the measurement result is sent to the controller 60 (S15-1 in FIG. 10). The controller 60 determines that there is no abnormality in lid attachment/detachment (S15-3) when the measurement value of the pressure sensor 32c falls within an appropriate pressure range (S15-2Y), and determines that there is abnormality in lid attachment/detachment (S15-4) when the measurement value of the pressure sensor 32c does not fall within the appropriate pressure range (S15-2N).

Also, the "appropriate pressure range" mentioned herein indicates a range of a suction pressure of the adsorption holding portions 32 (that is, the negative pressure of the pipe 32a) which is assumed when the adsorption holding portions 32 are not holding the lid 10c. In the above described lid attachment/detachment abnormality determination, it is thought that in a normal state, the lid attaching/detaching mechanism 30 disposed at the retracted position is not holding the lid 10c (see FIG. 7B), but in an abnormal state, the lid attaching/detaching mechanism 30 disposed at the retracted position is holding the lid 10c (see FIG. 8B). Therefore, when the pipe 32a is placed in a negative pressure state of such a degree that the adsorption holding portions 32 are capable of holding the lid 10c, it is estimated that the adsorption holding portions 32 are holding the lid 10c, and it is determined that the lid attaching/detaching mechanism 30 and the lid 10c are placed in an abnormal state. Meanwhile, when the pipe 32a is not placed in a negative pressure state of such a degree that the adsorption holding portions 32 are capable of holding the lid 10c, it is estimated that the adsorption holding portions 32 are not holding the lid 10c, and it is determined that the lid attaching/detaching mechanism 30 and the lid 10c are placed in a normal state.

In the above described lid attachment/detachment abnormality determination processing, when it is determined that there is no abnormality (N in S16 of FIG. 9A), the process proceeds to the next step S17. Meanwhile, in the above described lid attachment/detachment abnormality determination processing, when it is determined that there is abnormality (Y in S16), the controller 60 outputs a signal of an error (see "error output (b)" in FIG. 9A). Then, the storage 64 of the controller 60 stores error information, and the process proceeds to the next step S17.

In step S17, the lid attaching/detaching mechanism 30 present at the retracted position is moved toward the mounting position, and the lid attaching/detaching mechanism 30 is advanced so as to insert the key portions 31 of the lid attaching/detaching mechanism 30 into the key holes 10d of the lid 10c. Then, detection of the lid attaching/detaching mechanism 30 by the close sensor 38a is performed. When the close sensor 38a detects that the lid attaching/detaching mechanism 30 is disposed at the mounting position (Y in S18), the controller 60 estimates that the key portions 31 are normally engaged with the key holes 10d, and determines that there is no abnormality. The process proceeds to the next step S19. Meanwhile, when the close sensor 38a does not detect that the lid attaching/detaching mechanism 30 is disposed at the mounting position (N in S18), the controller 60 estimates that the key portions 31 are not properly engaged with the key holes 10d, and determines that there is abnormality. In this case, the controller 60 outputs a signal of an error (see "error output (c)" in FIG. 9A), the storage 64 of the controller 60 stores error information, and the process proceeds to the next step S19.

In step S19, in order to hold the lid 10c by adsorption by the adsorption holding portions 32, the vacuum pump 32b is turned ON such that the pipe 32a has a negative pressure, and in this state, measurement by the pressure sensor 32c is performed, and the measurement result is sent to the controller 60. When the measurement value of the pressure sensor 32c falls within an appropriate pressure range (Y in S20), the controller 60 estimates that the lid 10c is being properly held by the adsorption holding portions 32, and determines that there is no abnormality related to attachment/detachment of the lid 10c. The process proceeds to the next step S21 (see FIG. 9B). Meanwhile, when the measurement value of the pressure sensor 32c does not fall within the appropriate pressure range (N in S20), the controller 60 estimates that the lid 10c is not being properly held by the adsorption holding portions 32, and determines that there is abnormality related to attachment/detachment of the lid 10c. In this case, the controller 60 outputs a signal of an error (see "error output (d)" in FIG. 9A), the storage 64 of the controller 60 stores error information, and the process proceeds to the next step S21.

Also, the "appropriate pressure range" mentioned here indicates a range of a suction pressure of the adsorption holding portions 32 (that is, the negative pressure of the pipe 32a) which is assumed when the adsorption holding portions 32 are holding the lid 10c. In this abnormality determination (that is, the second abnormality determination), in a normal state, the lid attaching/detaching mechanism 30 disposed at the mounting position is properly in contact with the lid 10c disposed at the position of the opening 10b, and the lid 10c is properly held by adsorption by the lid attaching/detaching mechanism 30. Meanwhile, in an abnormal state, the lid attaching/detaching mechanism 30 is not properly in contact with the lid 10c at the mounting position, and thus the lid 10c is not being properly held by adsorption by the lid attaching/detaching mechanism 30. As such an abnormal state, for example, a case where the key portions 31 are not properly engaged with the key holes 10d (for example, a case where a direction of the key holes 10d is not appropriate or a case where the lid attaching/detaching mechanism 30 is inclined and is not properly in contact with the lid 10c) or a case where the lid 10c is not disposed at the opening 10b may be mentioned.

Next, in order to release the lid 10c from adsorption holding by the adsorption holding portions 32, the vacuum pump 32b is turned OFF and the negative pressure of the pipe 32a is released. In this state, measurement is performed by the pressure sensor 32c, and the measurement result is sent to the controller 60 (S21). When the measurement value of the pressure sensor 32c falls within an appropriate pressure range (Y in S22), the controller 60 estimates that the lid 10c is properly released from the adsorption holding, and determines that there is no abnormality. The process proceeds to the next step S23. Meanwhile, when the measurement value of the pressure sensor 32c does not fall within the appropriate pressure range (N in S22), the controller 60 estimates that the lid 10c is not properly released from the adsorption holding, and determines that there is abnormality. In this case, the controller 60 outputs a signal of an error and an alarm occurs (S22-1). The operator is notified of the abnormality. After the operator notified of the abnormality releases a negative pressure state of the pipe 32a and the adsorption holding of the lid 10c by the adsorption holding portions 32, the process proceeds to the next step S23.

After the negative pressure state of the pipe 32a and the adsorption holding of the lid 10c by the adsorption holding portions 32 are released, the movement mechanism 14 is driven to retract the cassette 10 placed on the cassette stage 12 to the undocking position (S23).

After the cassette 10 is disposed at the undocking position, the controller 60 determines the presence/absence of abnormality in the above described series of checking operations. When there is no abnormality in the above described series of checking operations (N in S24), since the lid 10c is locked while properly closing the opening 10b, the cassette 10 is unclamped from the cassette stage 12, and is carried out of the stage 11 by a cassette transportation mechanism (not illustrated) (S25).

Meanwhile, when there is abnormality in the above described series of checking operations (Y in S24), in order to perform checking, the cassette 10 on the cassette stage 12 is unclamped (S26), and the controller 60 causes the display 67 to display the error information stored in the storage 64 (S27). Through this displaying, it is possible to check (a) a lid attaching/detaching mechanism open error (see N in S13), (b) a lid attachment/detachment error (see Y in S16), (c) a lid attaching/detaching mechanism close error (see N in S18) and (d) a VAC ON error (see N in S20).

The operator checks the cassette 10 and makes the cassette 10 appropriate based on the error information, and then places the cassette 10 in the appropriate state, on the cassette stage 12 (S28). Then, the displaying of the error information is released (S29). In a state where the lid 10c is locked while properly closing the opening 10b, the cassette 10 is unclamped from the cassette stage 12, and is carried out of the stage 11 by the cassette transport mechanism (not illustrated) (S30).

As described above, in the first abnormality determination, the controller 60 determines the presence/absence of abnormality related to attachment/detachment of the lid 10c based on detection results of the abnormality detection sensors 39a and 39b after the lid attaching/detaching mechanism 30 is moved from the mounting position toward the retracted position in a state where the lid 10c is disposed at the position of the opening 10b. Also, in the second abnormality determination, the controller 60 determines the presence/absence of abnormality related to attachment/detachment of the lid based on the result of measurement by the pressure sensor 32c performed in a state where the adsorption holding portions 32 execute suction for holding the lid 10c after the lid attaching/detaching mechanism 30 is moved toward the mounting position after the first abnormality determination. Then, the controller 60 performs the lid attachment/detachment abnormality determination based on whether the lid attaching/detaching mechanism 30 is holding the lid 10c based on the measurement result of the pressure sensor 32c. In this manner, the lid attachment/detachment abnormality determination is performed twice as the first abnormality determination and the second abnormality determination so that it is possible to check that the lid 10c is properly mounted to the cassette 10 storing the wafers W, with very high reliability.

Also, in the substrate storage apparatus 100 and the substrate storage method as described above, the lid attachment/detachment abnormality determination is performed in a state where the lid attaching/detaching mechanism 30 is disposed at the retracted position, but the above described lid attachment/detachment abnormality determination may be performed during movement of the lid attaching/detaching mechanism 30 from the mounting position toward the retracted position. Also, the above described lid attachment/detachment abnormality determination may be performed during movement of the lid attaching/detaching mechanism 30 from the retracted position toward the mounting position. That is, at a position and a timing (that is, a position other than the mounting position, and a timing when the lid attaching/detaching mechanism 30 is disposed at the position other than the mounting position) at which the lid attaching/detaching mechanism 30 is not in contact with the lid 10c disposed at the opening 10b in a normal state, the pressure sensor 32c may perform measurement, and the lid attachment/detachment abnormality determination may be performed based on the measurement result.

Second Embodiment

In the present embodiment, the same or similar components as/to those in the above described first embodiment are denoted by the same reference numerals, and detailed descriptions thereof will be omitted.

In the present embodiment, the close sensor 38a and the abnormality detection sensors 39a and 39b function as a lid holding sensor, and the controller 60 (that is, an abnormality determination unit) determines a lid attachment/detachment abnormality related to attachment/detachment of the lid 10c based on the detection results of the close sensor 38a and the abnormality detection sensors 39a and 39b.

The abnormality detection sensors 39a and 39b are sensors that detect the presence/absence of an object at a specific position between the mounting position and the retracted position in a path of the lid attaching/detaching mechanism 30. Meanwhile, the close sensor 38a is a sensor that detects the presence/absence of the lid attaching/detaching mechanism 30, and detects the lid attaching/detaching mechanism 30 disposed at the mounting position but does not detect the lid attaching/detaching mechanism 30 disposed at the retracted position. In the apparatus illustrated in FIG. 2, the Y-axis drive mechanism 37 having a cylinder-type housing adjusts a protrusion amount of a piston provided as a part of the lid attaching/detaching mechanism 30, from the housing so as to drive the entire lid attaching/detaching mechanism 30 in the Y-axis direction. In this apparatus configuration, the close sensor 38a detects the tip end position of the piston of the lid attaching/detaching mechanism 30, within the housing of the Y-axis drive mechanism 37 so as to detect whether the lid attaching/detaching mechanism 30 is disposed at the mounting position.

Figure 11A:
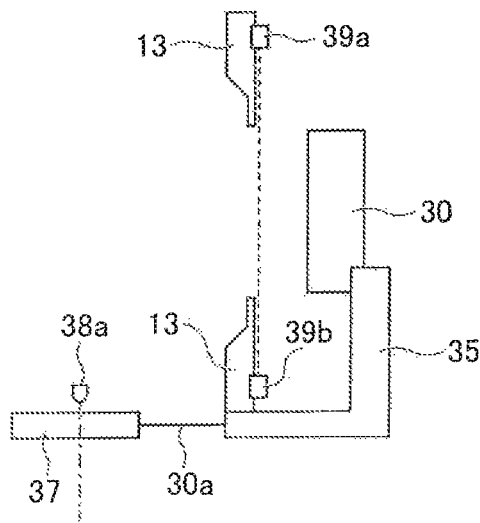
FIG. 11A is a schematic view illustrating the arrangement relationship between the lid attaching/detaching mechanism, a close sensor, and abnormality detection sensors in a case where in a normal state, lid attachment/detachment abnormality determination is performed, which illustrates a state where the lid attaching/detaching mechanism is disposed at the retracted position.
Figure 11B:
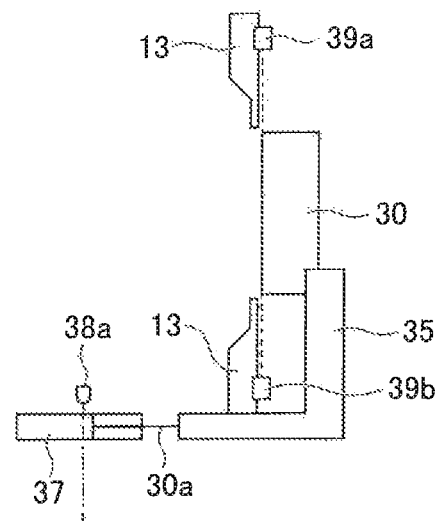
FIG. 11B is a schematic view illustrating the arrangement relationship between the lid attaching/detaching mechanism, the close sensor, and the abnormality detection sensors in a case where in a normal state, lid attachment/detachment abnormality determination is performed, which illustrates a state where the lid attaching/detaching mechanism is disposed between the retracted position and the mounting position.
Figure 11C:
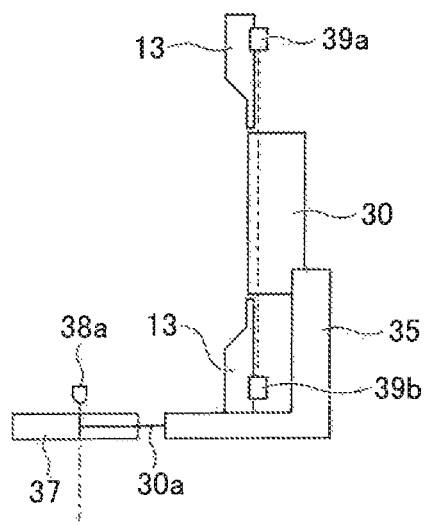
FIG. 11C is a schematic view illustrating the arrangement relationship between the lid attaching/detaching mechanism, the close sensor, and the abnormality detection sensors in a case where in a normal state, lid attachment/detachment abnormality determination is performed, which illustrates a state where the lid attaching/detaching mechanism is disposed at the mounting position.
Figure 12A:
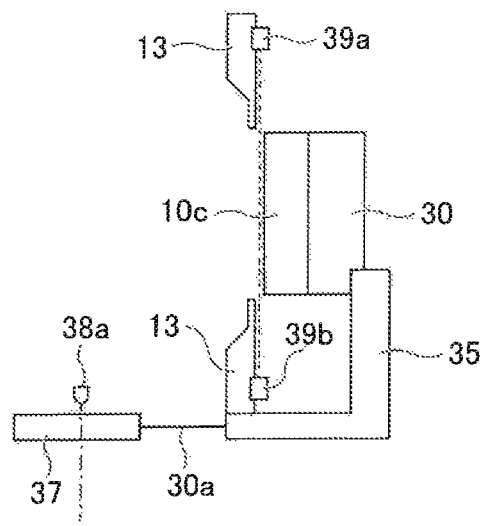
FIG. 12A is a schematic view illustrating the arrangement relationship between the lid attaching/detaching mechanism, the close sensor, and the abnormality detection sensors in a case where in an abnormal state, lid attachment/detachment abnormality determination is performed, which illustrates a state where the lid attaching/detaching mechanism is disposed at the retracted position.
Figure 12B:
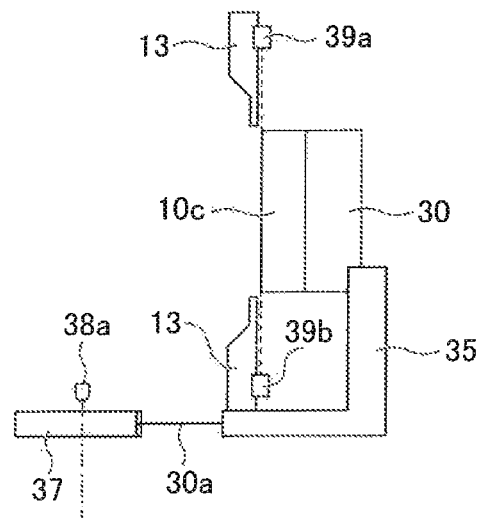
FIG. 12B is a schematic view illustrating the arrangement relationship between the lid attaching/detaching mechanism, the close sensor, and the abnormality detection sensors in a case where in an abnormal state, lid attachment/detachment abnormality determination is performed, which illustrates a state where the lid attaching/detaching mechanism is disposed between the retracted position and the mounting position.
Figure 12C:
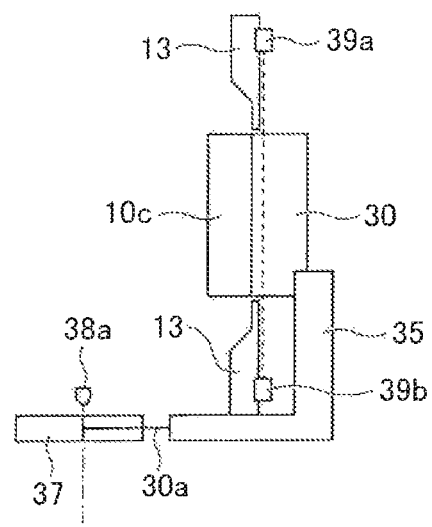
FIG. 12C is a schematic view illustrating the arrangement relationship between the lid attaching/detaching mechanism, the close sensor, and the abnormality detection sensors in a case where in an abnormal state, lid attachment/detachment abnormality determination is performed, which illustrates a state where the lid attaching/detaching mechanism is disposed at the mounting position.

FIG. 11A to FIG. 11C are schematic views illustrating the arrangement relationship between the lid attaching/detaching mechanism 30, the close sensor 38a, and the abnormality detection sensors 39a and 39b in a case where in a normal state, lid attachment/detachment abnormality determination is performed. FIG. 11A illustrates a state where the lid attaching/detaching mechanism 30 is disposed at the retracted position, FIG. 11B illustrates a state where the lid attaching/detaching mechanism 30 is disposed between the retracted position and the mounting position, and FIG. 11C illustrates a state where the lid attaching/detaching mechanism 30 is disposed at the mounting position. FIG. 12A to FIG. 12C are schematic views illustrating the arrangement relationship between the lid attaching/detaching mechanism 30, the close sensor 38a, and the abnormality detection sensors 39a and 39b in a case where in an abnormal state, lid attachment/detachment abnormality determination is performed. FIG. 12A illustrates a state where the lid attaching/detaching mechanism 30 is disposed at the retracted position, FIG. 12B illustrates a state where the lid attaching/detaching mechanism 30 is disposed between the retracted position and the mounting position, and FIG. 12C illustrates a state where the lid attaching/detaching mechanism 30 is disposed at the mounting position.

In the lid attachment/detachment abnormality determination, since the lid attaching/detaching mechanism 30 in the normal state is not holding the lid 10c, while the lid attaching/detaching mechanism 30 is disposed at the retracted position, the abnormality detection sensors 39a and 39b do not detect an object, and a detection signal of the abnormality detection sensors 39a and 39b is set to OFF (see FIG. 11A). Then, during movement of the lid attaching/detaching mechanism 30 from the retracted position toward the mounting position, the abnormality detection sensors 39a and 39b detect the lid attaching/detaching mechanism 30 (see FIG. 11B), and according to the detection timing, a detection signal indicating detection-ON is sent from the abnormality detection sensors 39a and 39b to the controller 60. Then, when the lid attaching/detaching mechanism 30 has reached the mounting position, the close sensor 38a detects a piston 30a of the lid attaching/detaching mechanism 30 (see FIG. 11C), and according to the detection timing, a detection signal indicating detection-ON is sent from the close sensor 38a to the controller 60.

Meanwhile, in the lid attachment/detachment abnormality determination, in a case where the lid attaching/detaching mechanism 30 holds the lid 10c and thus the lid attaching/detaching mechanism 30 is placed in the abnormal state, while the lid attaching/detaching mechanism 30 is disposed at the retracted position, the abnormality detection sensors 39a and 39b do not detect an object (see FIG. 12A). However, during movement of the lid attaching/detaching mechanism 30 from the retracted position toward the mounting position, the abnormality detection sensors 39a and 39b detect the lid 10c (see FIG. 12B), and according to the detection timing, a detection signal indicating detection-ON is sent from the abnormality detection sensors 39a and 39b to the controller 60. In this manner, when the lid attaching/detaching mechanism 30 is placed in the abnormal state, the abnormality detection sensors 39a and 39b detect the lid 10c in advance of the lid attaching/detaching mechanism 30. Therefore, based on a timing when the lid attaching/detaching mechanism 30 starts to move from the retracted position, a detection timing of the abnormality detection sensors 39a and 39b as illustrated in FIG. 12B is earlier than a detection timing of the abnormality detection sensors 39a and 39b as illustrated in FIG. 11B.

Then, when the lid attaching/detaching mechanism 30 has reached the mounting position, the close sensor 38a detects the piston 30a of the lid attaching/detaching mechanism 30 (see FIG. 12C), and according to the detection timing, a detection signal indicating detection-ON is sent from the close sensor 38a to the controller 60. In this manner, the close sensor 38a illustrated in FIG. 12C detects the piston 30a of the lid attaching/detaching mechanism 30 like the close sensor 38a illustrated in FIG. 11C. Therefore, based on a timing when the lid attaching/detaching mechanism 30 starts to move from the retracted position, a detection timing of the close sensor 38a as illustrated in FIG. 12C is the same as a detection timing of the close sensor 38a as illustrated in FIG. 11C.

For this reason, a time from the detection timing of the abnormality detection sensors 39a and 39b to the detection timing of the close sensor 38a (that is, a time difference between both detection timings) in a case of the lid attaching/detaching mechanism 30 in the abnormal state (see FIGS. 12A to 12C) is longer than that in a case of the lid attaching/detaching mechanism 30 in the normal state (see FIGS. 11A to 11C).

Therefore, the controller 60 of the present embodiment (that is, the abnormality determination unit) performs the lid attachment/detachment abnormality determination based on a time difference between the timing when the abnormality detection sensors 39a and 39b detect an object at a specific position between the retracted position and the mounting position, and the timing when the close sensor 38a detects the lid attaching/detaching mechanism 30 when the lid attaching/detaching mechanism 30 moves toward the mounting position from the retracted position.

Figure 13:
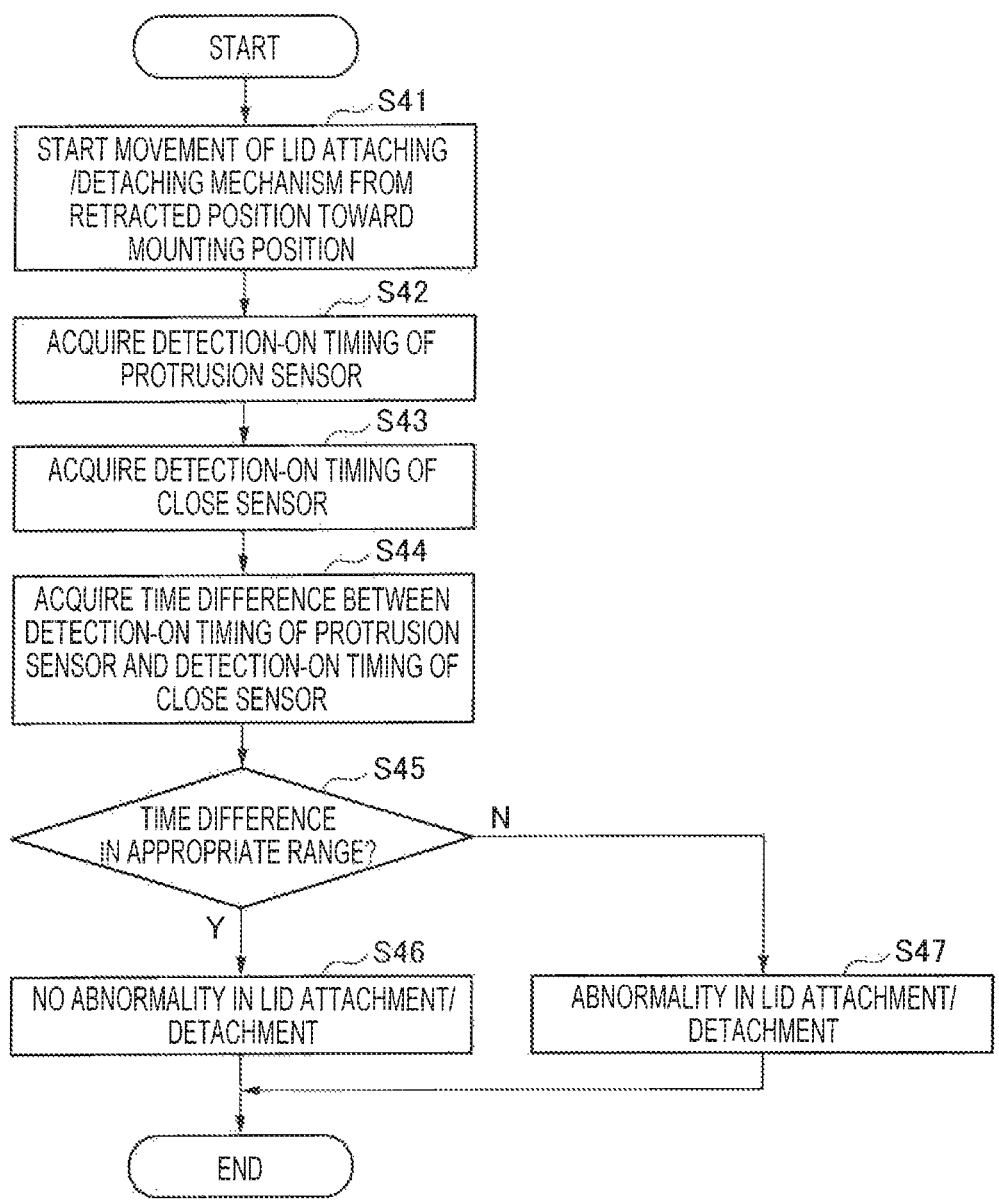
FIG. 13 is a flow chart of a lid attachment/detachment abnormality determination processing according to a second embodiment.

FIG. 13 is a flow chart of a lid attachment/detachment abnormality determination processing according to the second embodiment.

In the lid attachment/detachment abnormality determination processing of the present embodiment, first, the lid attaching/detaching mechanism 30 starts to move from the retracted position toward the mounting position (S41 in FIG. 13). Then, the controller 60 acquires a timing when the abnormality detection sensors 39a and 39b are set to detection-ON (S42), acquires a timing when the close sensor 38a is set to detection-ON (S43), and acquires a time difference between the timing when the abnormality detection sensors 39a and 39b are set to detection-ON and the timing when the close sensor 38a is set to detection-ON (S44). Then, the controller 60 determines that there is no abnormality in lid attachment/detachment (S46) when the time difference falls within an appropriate time range (Y in S45), and determines that there is abnormality in lid attachment/detachment (S47) when the time difference does not fall within the appropriate time range (N in S45). Also, the "appropriate time range" mentioned herein indicates a range of the above time difference, which is assumed when the adsorption holding portions 32 are not holding the lid 10c. The "appropriate time range" may be varied by various factors such as a moving speed of the lid attaching/detaching mechanism 30, sizes of the lid attaching/detaching mechanism 30 and the lid 10c, and detection positions of the abnormality detection sensors 39a and 39b and the close sensor 38a, but a time range from about 0.5 sec to 1.5 sec may be typically set as the "appropriate time range."

Also, the lid attachment/detachment abnormality determination of the present embodiment as illustrated in FIG. 13 may be performed together with the first abnormality determination (see S14 in FIG. 9A) and/or the second abnormality determination (see S18 to S20 in FIG. 9A) as described above or may be independently performed irrespective of the first abnormality determination and the second abnormality determination. When the lid attachment/detachment abnormality determination is performed in the processing illustrated in FIG. 9A and FIG. 9B, the lid attachment/detachment abnormality determination of the above described first embodiment (see S15 in FIG. 9A) is performed after the lid attaching/detaching mechanism 30 is retracted from the mounting position to the retracted position (see S12 in FIG. 9A). Meanwhile, it is desirable that the lid attachment/detachment abnormality determination of the present embodiment is performed when the lid attaching/detaching mechanism 30 advances from the retracted position toward the mounting position (see S17 in FIG. 9A).

Third Embodiment

In the present embodiment, the same or similar components as/to those in the above described second embodiment are denoted by the same reference numerals, and detailed descriptions thereof will be omitted.

In the present embodiment, as in the above described second embodiment, the close sensor 38a and the abnormality detection sensors 39a and 39b function as a lid holding sensor, and the controller 60 (that is, an abnormality determination unit) determines a lid attachment/detachment abnormality related to attachment/detachment of the lid 10c based on the detection results of the close sensor 38a and the abnormality detection sensors 39a and 39b.

Meanwhile, the controller 60 (that is, the abnormality determination unit) of the present embodiment performs lid attachment/detachment abnormality determination based on a time difference between a timing when the close sensor 38a does not detect the lid attaching/detaching mechanism 30 and a timing when the abnormality detection sensors 39a and 39b do not detect an object at a specific position between the mounting position and the retracted position when the lid attaching/detaching mechanism 30 moves from the mounting position toward the retracted position.

Based on a timing when the lid attaching/detaching mechanism 30 starts to move from the mounting position toward the retracted position, the timing when the abnormality detection sensors 39a and 39b do not detect an object (that is, a detection OFF timing) in a case where the lid attaching/detaching mechanism 30 is not holding the lid 10c is earlier than that in a case where the lid attaching/detaching mechanism 30 is holding the lid 10c. Meanwhile, based on the timing when the lid attaching/detaching mechanism 30 starts to move from the mounting position toward the retracted position, the timing when the close sensor 38a does not detect the lid attaching/detaching mechanism 30 (that is, the piston 30a) (that is, a detection OFF timing) in a case where the lid attaching/detaching mechanism 30 is holding the lid 10c is the same as that in a case where the lid attaching/detaching mechanism 30 is not holding the lid 10c.

For this reason, a time from the detection OFF timing of the close sensor 38a to the detection OFF timing of the abnormality detection sensors 39a and 39b (that is, a time difference between both detection OFF timings) in a case where the lid attaching/detaching mechanism 30 is placed in an abnormal state by holding the lid 10c is longer than that in a case where the lid attaching/detaching mechanism 30 is placed in a normal state by not holding the lid 10c.

Figure 14:
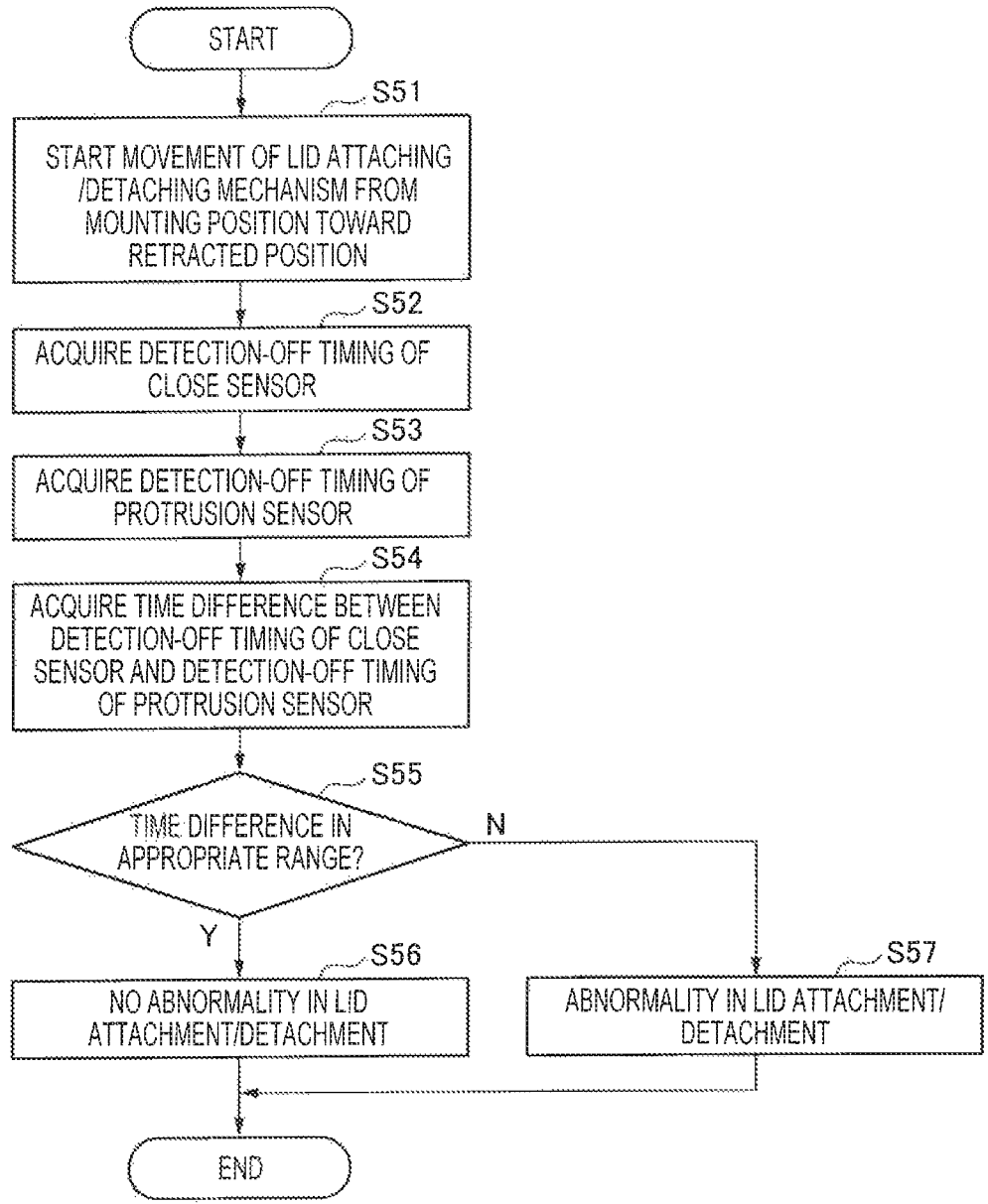
FIG. 14 is a flow chart of a lid attachment/detachment abnormality determination processing according to a third embodiment.

FIG. 14 is a flow chart of a lid attachment/detachment abnormality determination processing according to the third embodiment.

In the lid attachment/detachment abnormality determination processing of the present embodiment, first, the lid attaching/detaching mechanism 30 starts to move from the mounting position toward the retracted position (S51 in FIG. 14). Then, the controller 60 acquires a timing when the close sensor 38a is set to detection-OFF (S52), acquires a timing when the abnormality detection sensors 39a and 39b are set to detection-OFF (S53), and acquires a time difference between the timing when the close sensor 38a is set to detection-OFF and the timing when the abnormality detection sensors 39a and 39b are set to detection-OFF (S54). Then, the controller 60 determines that there is no abnormality related to attachment/detachment of the lid 10c (556) when the time difference falls within an appropriate time range (Y in S55), and determines that there is abnormality related to attachment/detachment of the lid 10c (S57) when the time difference does not fall within the appropriate time range (N in S55). Also, the "appropriate time range" mentioned herein indicates a range of the above time difference, which is assumed when the adsorption holding portions 32 are not holding the lid 10c.

Also, the lid attachment/detachment abnormality determination of the present embodiment as illustrated in FIG. 14 may be performed together with the first abnormality determination (see S14 in FIG. 9A) and/or the second abnormality determination (see S18 to S20 in FIG. 9A) as described above or may be independently performed irrespective of the first abnormality determination and the second abnormality determination. When the lid attachment/detachment abnormality determination of the present embodiment is performed in the processing illustrated in FIG. 9A and FIG. 9B, it is desirable that the lid attachment/detachment abnormality determination is performed during retraction of the lid attaching/detaching mechanism 30 from the mounting position to the retracted position (see S12 in FIG. 9A).

Fourth Embodiment

In the present embodiment, the same or similar components as/to those in the above described first embodiment are denoted by the same reference numerals, and detailed descriptions thereof will be omitted.

Figure 15:
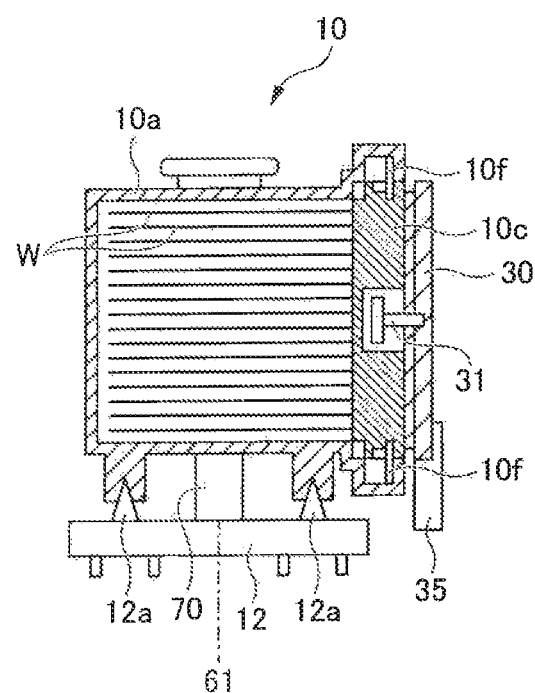
FIG. 15 is a sectional view simply illustrating the cassette and the lid attaching/detaching mechanism according to a fourth embodiment.

FIG. 15 is a sectional view simply illustrating the cassette 10 and the lid attaching/detaching mechanism 30 according to a fourth embodiment.

In the present embodiment, a weight sensor 70 is provided on the cassette stage 12. The weight sensor 70 measures the weight of the cassette 10 disposed on the cassette stage 12 of the stage 11, and transmits the measurement result to the controller 60.

The controller 60 (that is, an abnormality determination unit) of the present embodiment performs lid attachment/detachment abnormality determination based on the measurement result of the weight sensor 70. When the lid 10c is disposed and locked at the position of the opening 10b, the weight of the cassette 10 also includes the weight of the lid 10c. Meanwhile, when the lid 10c is not disposed at the position of the opening 10b, the weight of the cassette 10 does not include the weight of the lid 10c. Therefore, the weight of the cassette 10 measured by the weight sensor 70 is reduced in a case where the lid attaching/detaching mechanism 30 is placed in an abnormal state by holding the lid 10c (see FIG. 8B), as compared to that in a case where the lid attaching/detaching mechanism 30 is placed in a normal state by not holding the lid 10c (see FIG. 7B).

Accordingly, the controller 60 of the present embodiment acquires the result of measurement performed by the weight sensor 70 while the lid attaching/detaching mechanism 30 is separated from the mounting position, and then determines that there is no abnormality in lid attachment/detachment when the measurement result falls within an appropriate weight range, and determines that there is abnormality in lid attachment/detachment when the measurement result does not fall within the appropriate weight range. Also, the "appropriate weight range" mentioned herein indicates the weight of the cassette 10, which is assumed when the lid attaching/detaching mechanism 30 is not holding the lid 10c, that is, a weight range of the cassette 10 that stores processed wafers W and is sealed by the lid 10c.

Also, the lid attachment/detachment abnormality determination of the present embodiment may be performed together with the first abnormality determination (see S14 in FIG. 9A) and/or the second abnormality determination (see S18 to S20 in FIG. 9A) as described above or may be independently performed irrespective of the first abnormality determination and the second abnormality determination. When the lid attachment/detachment abnormality determination of the present embodiment is performed in the processing illustrated in FIG. 9A and FIG. 9B, it is desirable that the lid attachment/detachment abnormality determination is performed after the lid attaching/detaching mechanism 30 starts to move from the mounting position toward the retracted position (see S12 in FIG. 9A), or before the lid attaching/detaching mechanism 30 is disposed at the mounting position after the lid attaching/detaching mechanism 30 moves from the retracted position toward the mounting position (see S17 in FIG. 9A). That is, it is desirable that the lid attachment/detachment abnormality determination of the present embodiment is performed while the lid attaching/detaching mechanism 30 is disposed at a position other than the mounting position.

Also, the weight sensor 70 illustrated in FIG. 15 directly measures the weight of the cassette 10, but a sensor that indirectly measures the weight of the cassette 10 may be used as a weight sensor. For example, a weight sensor that measures the weight of the cassette 10 and the cassette stage 12 may be used.

Fifth Embodiment

In the present embodiment, the same or similar components as/to those in the above described first embodiment are denoted by the same reference numerals, and detailed descriptions thereof will be omitted.

Figure 16:
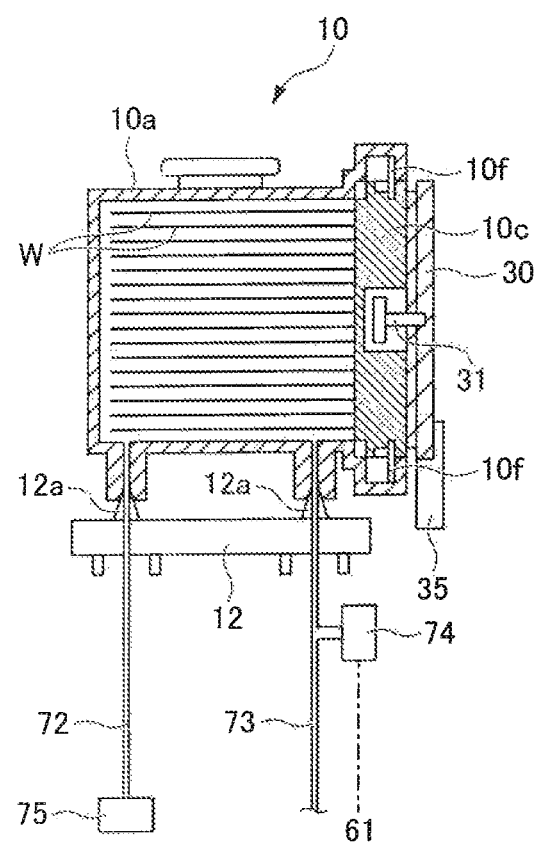
FIG. 16 is a sectional view simply illustrating the cassette and the lid attaching/detaching mechanism according to a fifth embodiment.

FIG. 16 is a sectional view simply illustrating the cassette 10 and the lid attaching/detaching mechanism 30 according to a fifth embodiment.

In the present embodiment, a gas inflow path 72 and a gas outflow path 73 that communicate with the inside of the cassette 10 (that is, the inside of the cassette body 10a) disposed on the cassette stage 12, and a pressure sensor 74 that detects the pressure of the gas outflow path 73 and transmits the detection result to the controller 60 are provided. A gas is sent from a gas supply unit 75 into the cassette 10 via the gas inflow path 72, and a gas inside the cassette 10 flows out into the gas outflow path 73.

Also, the gas sent from the gas inflow path 72 into the cassette 10 is not particularly limited, but an inert gas such as nitrogen is typically sent from the gas inflow path 72 into the cassette 10. Also, the amount of the gas flowing into the cassette 10 from the gas inflow path 72 and the amount of the gas flowing out of the inside of the cassette 10 toward the gas outflow path 73 are not particularly limited. Meanwhile, each element is configured such that in a state where the cassette 10 is sealed by the lid 10c, the atmospheric pressure inside the cassette 10 and the atmospheric pressure within the gas outflow path 73 may increase by causing the gas to flow into the cassette 10 from the gas inflow path 72.

Also, although the atmospheric pressure inside the cassette 10 does not necessarily have to match the atmospheric pressure of the gas outflow path 73, the atmospheric pressure of the gas outflow path 73 detected by the pressure sensor 74 has a correlation with the atmospheric pressure inside the cassette 10. Therefore, the pressure sensor 74 directly measures the atmospheric pressure of the gas outflow path 73, but indirectly measures the atmospheric pressure inside the cassette 10.

In this manner, in the present embodiment, the gas supply unit 75 that supplies a gas into the cassette 10 disposed on the cassette stage 12 of the stage 11, and the pressure sensor 74 that measures the atmospheric pressure within the cassette 10 are provided. Then, the controller 60 (that is, an abnormality determination unit) of the present embodiment performs lid attachment/detachment abnormality determination based on the measurement result of the pressure sensor 74 during gas supply into the cassette 10 by the gas supply unit 75 or after the supply.

When the lid 10c is disposed at the position of the opening 10b and is properly locked, the cassette 10 is sealed, and the atmospheric pressure within the cassette 10 increases by gas supply into the cassette 10 from the gas supply unit 75. Meanwhile, in a case where the lid 10c is not properly disposed at the position of the opening 10b, since a part or all of the opening 10b is open, even when the gas is supplied from the gas supply unit 75 into the cassette 10, the atmospheric pressure within the cassette 10 does not increase or an increase of the atmospheric pressure is slight.

Accordingly, the controller 60 of the present embodiment acquires the result of measurement performed by the pressure sensor 74 while the lid attaching/detaching mechanism 30 is separated from the mounting position, and then determines that there is no abnormality in lid attachment/detachment when the measurement result falls within an appropriate atmospheric pressure range, and determines that there is abnormality in lid attachment/detachment when the measurement result does not fall within the appropriate atmospheric pressure range. Also, the "appropriate atmospheric pressure range" mentioned herein indicates the atmospheric pressure range within the cassette 10, which is assumed when the gas is supplied from the gas supply unit 75 into the cassette 10 in a state where the cassette 10 is sealed by the lid 10c.

Also, the lid attachment/detachment abnormality determination of the present embodiment may be performed together with the first abnormality determination (see S14 in FIG. 9A) and/or the second abnormality determination (see S18 to S20 in FIG. 9A) as described above, or may be independently performed irrespective of the first abnormality determination and the second abnormality determination. It is desirable that the lid attachment/detachment abnormality determination of the present embodiment is performed in the processing illustrated in FIG. 9A and FIG. 9B, after the lid attaching/detaching mechanism 30 starts to move from the mounting position toward the retracted position (see S12 in FIG. 9A), or before the lid attaching/detaching mechanism 30 is disposed at the mounting position after the lid attaching/detaching mechanism 30 moves from the retracted position toward the mounting position (see S17 in FIG. 9A). That is, it is desirable that the lid attachment/detachment abnormality determination of the present embodiment is performed while the lid attaching/detaching mechanism 30 is disposed at a position other than the mounting position.

Sixth Embodiment

In the present embodiment, the same or similar components as/to those in the above described first embodiment are denoted by the same reference numerals, and detailed descriptions thereof will be omitted.

Figure 17A:
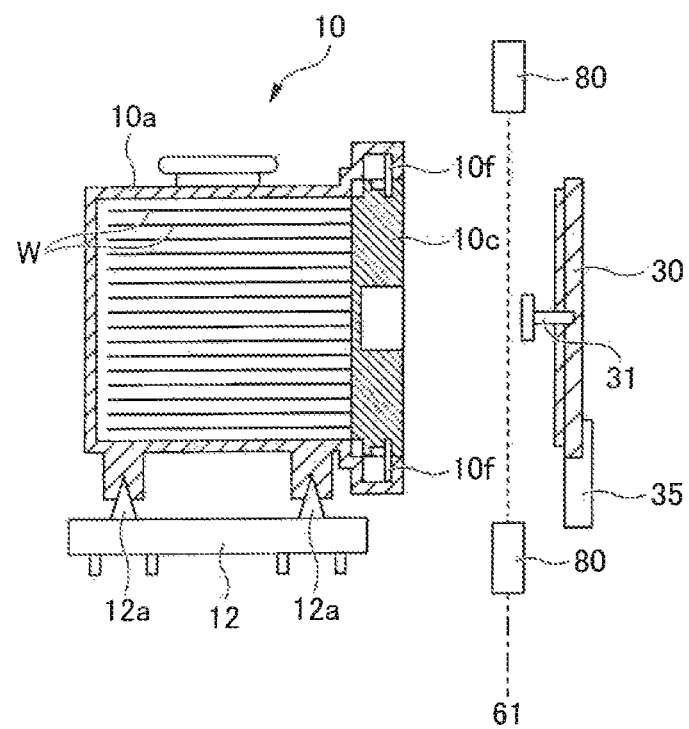
FIG. 17A is a sectional view simply illustrating the cassette and the lid attaching/detaching mechanism according to a sixth embodiment, which illustrates a normal state.
Figure 17B:
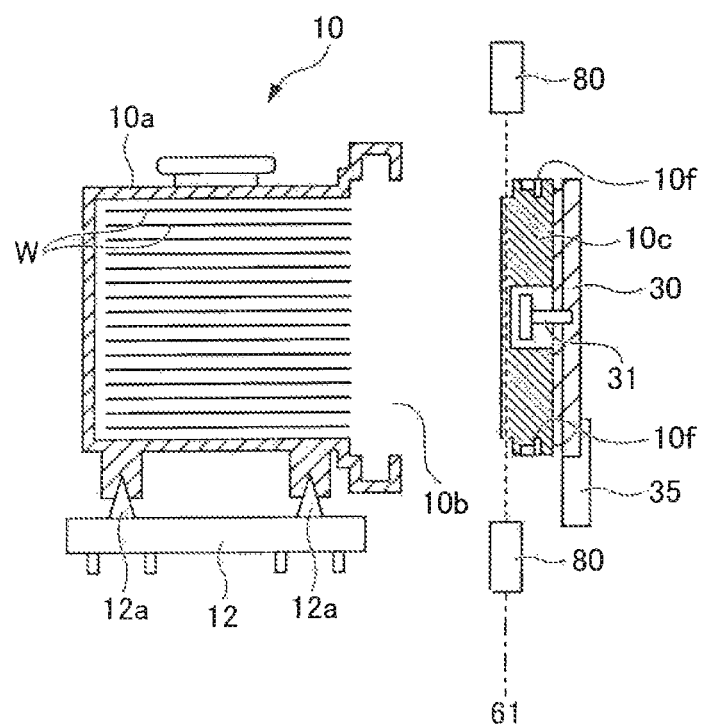
FIG. 17B is a sectional view simply illustrating the cassette and the lid attaching/detaching mechanism according to the sixth embodiment, which illustrates an abnormal state.

FIG. 17A and FIG. 17B are sectional views simply illustrating the cassette 10 and the lid attaching/detaching mechanism 30 according to the sixth embodiment. FIG. 17A illustrates a normal state, and FIG. 17B illustrates an abnormal state.

In the present embodiment, a lid detection sensor 80 that directly detects the lid 10c held by the lid attaching/detaching mechanism 30 disposed at the retracted position is provided as a lid holding sensor, and the measurement result of the lid detection sensor 80 is transmitted to the controller 60.

The controller 60 (that is, an abnormality determination unit) of the present embodiment performs lid attachment/detachment abnormality determination based on the detection result of the lid detection sensor 80. In the lid attachment/detachment abnormality determination, it is thought that in a normal state, the lid attaching/detaching mechanism 30 disposed at the retracted position is not holding the lid 10c (see FIG. 7B), but in an abnormal state, the lid attaching/detaching mechanism 30 disposed at the retracted position is holding the lid 10c (see FIG. 8B). In a state where the lid attaching/detaching mechanism 30 is disposed at the retracted position, when the lid attaching/detaching mechanism 30 is not holding the lid 10c, the lid detection sensor 80 does not detect an object and is placed in a detection-OFF state (see FIG. 17A). Meanwhile, in a state where the lid attaching/detaching mechanism 30 is disposed at the retracted position, when the lid attaching/detaching mechanism 30 is holding the lid 10c, the lid detection sensor 80 detects the lid 10c, and a detection signal indicating detection-ON is sent from the lid detection sensor 80 to the controller 60 (see FIG. 17B).

Therefore, in a state where the lid attaching/detaching mechanism 30 is disposed at the retracted position, the controller 60 of the present embodiment determines that there is no abnormality in lid attachment/detachment when not receiving a detection signal indicating detection-ON from the lid detection sensor 80, and determines that there is abnormality in lid attachment/detachment when receiving a detection signal indicating detection-ON from the lid detection sensor 80.

Also, the lid attachment/detachment abnormality determination of the present embodiment may be performed together with the first abnormality determination (see S14 in FIG. 9A) and/or the second abnormality determination (see S18 to S20 in FIG. 9A) as described above, or may be independently performed irrespective of the first abnormality determination and the second abnormality determination. When the lid attachment/detachment abnormality determination of the present embodiment is performed in the processing illustrated in FIG. 9A and FIG. 9B, it is desirable that the lid attachment/detachment abnormality determination is performed while the lid attaching/detaching mechanism 30 moves from the mounting position toward the retracted position (see S12 in FIG. 9A), and the lid attaching/detaching mechanism 30 is disposed at the retracted position.

<Modifications>

The present disclosure is not limited to the above described embodiments and modifications, but may include various aspects to which various modifications conceivable by a person skilled in the art are applied. The effects exerted by the present disclosure are also not limited to the above described matters. Therefore, various additions, modifications and partial deletions may be made to each element described in the claims and the specification within a range not departing from the technical idea and spirit of the present disclosure.

For example, the lid attachment/detachment abnormality determination may be performed based on a plurality of methods by combining two or more of the above described embodiments.

Also, in the above described embodiments, the substrate storage apparatus and the substrate storage method according to the embodiments of the present disclosure are applied to the processing unit 2 that performs a processing such as resist coating or development processing, but the present disclosure may also be applied to apparatuses and methods that perform other processings. For example, the present disclosure may also be applied to a processing apparatus and a processing method that perform a semiconductor processing such as a cleaning processing and an etching processing of a substrate.

DESCRIPTION OF SYMBOLS

10: cassette
10b: opening
10c: lid
11: stage
30: lid attaching/detaching mechanism
32c: pressure sensor
39a, 39b: abnormality detection sensor
60: controller
W: wafer

What is claimed is:

1. A substrate storage apparatus comprising:
a stage on which a cassette storing substrates is disposed, the cassette having an opening and a lid detachably mounted to the opening;
a lid attaching/detaching plate that performs attaching/detaching of the lid to/from the opening of the cassette disposed on the stage, the lid attaching/detaching plate being provided to be movable between a mounting position in contact with the lid disposed at a position of the opening and a retracted position not in contact with the lid disposed at the position of the opening, the lid attaching/detaching plate including a holder that holds the lid by suction;
a lid holding sensor that detects whether the lid is held by the lid attaching/detaching plate, the lid holding sensor including a suction pressure sensor that measures a suction pressure acting on the lid when the holder holds the lid and measures the suction pressure in a state where the lid attaching/detaching plate is disposed at a position other than the mounting position; and
a controller that determines presence/absence of abnormality related to an attachment/detachment of the lid based on estimation as to whether the lid attaching/detaching plate holds the lid, which is derived from a measurement result of the suction pressure sensor.

2. The substrate storage apparatus according to claim 1, wherein the lid holding sensor includes an abnormality detection sensor that detects presence/absence of an object at a specific position between the mounting position and the retracted position, and a close sensor that detects presence/absence of the lid attaching/detaching plate, the close sensor detecting the lid attaching/detaching plate disposed at the mounting position but not detecting the lid attaching/detaching plate disposed at the retracted position, and
the controller determines the presence/absence of the abnormality based on detection results of the abnormality detection sensor and the close sensor.

3. The substrate storage apparatus according to claim 2, wherein, when the lid attaching/detaching plate moves from the retracted position toward the mounting position, the controller determines the presence/absence of the abnormality based on a time difference between a timing when the abnormality detection sensor detects the object at the specific position and a timing when the close sensor detects the lid attaching/detaching plate.

4. The substrate storage apparatus according to claim 2, wherein, when the lid attaching/detaching plate moves from the mounting position toward the retracted position, the controller determines the presence/absence of the abnormality based on a time difference between a timing when the close sensor does not detect the lid attaching/detaching plate and a timing when the abnormality detection sensor does not detect the object at the specific position.

5. The substrate storage apparatus according to claim 1, wherein the lid holding sensor includes a lid detection sensor that detects the lid held by the lid attaching/detaching plate disposed at the retracted position, and
the controller determines the presence/absence of the abnormality based on a detection result of the lid detection sensor.

6. The substrate storage apparatus according to claim 1, wherein the lid attaching/detaching plate includes a key, and a holder that holds the lid,
the lid includes a key hole, and a latch that is disposed at a locking position and an unlocking position by the key engaged with the key hole,
the holder holds the lid by suction,
the substrate storage apparatus is provided with an abnormality detection sensor that detects presence/absence of an object at a specific position between the mounting position and the retracted position, a close sensor that detects presence/absence of the lid attaching/detaching plate, and a suction pressure sensor that measures a suction pressure acting on the lid when the holder holds the lid, the close sensor detecting the lid attaching/ detaching plate disposed at the mounting position but not detecting the lid attaching/detaching plate disposed at the retracted position, the controller performs a first abnormality determination different from the determination of the presence/absence of the abnormality, in which the presence/absence of the abnormality related to the attachment/detachment of the lid is determined based on a detection result of the abnormality detection sensor after the lid attaching/detaching plate is moved from the mounting position toward the retracted position in a state where the lid is disposed at the position of the opening and the latch is disposed at the locking position, and the controller performs a second abnormality determination different from the determination of the presence/absence of the abnormality, in which the presence/absence of the abnormality related to the attachment/detachment of the lid is determined based on a result of measurement by the suction pressure sensor performed in a state where the holding portion executes suction for holding the lid after the lid attaching/detaching plate is moved toward the mounting position.

7. A substrate storage apparatus comprising:

a stage on which a cassette storing substrates is disposed, the cassette having an opening and a lid detachably mounted to the opening;

a lid attaching/detaching plate that performs attaching/detaching of the lid to/from the opening of the cassette disposed on the stage, the lid attaching/detaching plate being provided to be movable between a mounting position in contact with the lid disposed at a position of the opening and a retracted position not in contact with the lid disposed at the position of the opening;

a lid holding sensor that detects whether the lid is held by the lid attaching/detaching plate, the lid holding sensor including a weight sensor that measures a weight of the cassette disposed on the stage; and a controller that determines a presence/absence of an abnormality related to an attachment/detachment of the lid based on a measurement result of the weight sensor.

8. A substrate storage apparatus comprising:

a stage on which a cassette storing substrates is disposed, the cassette having an opening and a lid detachably mounted to the opening;

a lid attaching/detaching plate that performs attaching/detaching of the lid to/from the opening of the cassette disposed on the stage, the lid attaching/detaching plate being provided to be movable between a mounting position in contact with the lid disposed at a position of the opening and a retracted position not in contact with the lid disposed at the position of the opening;

a lid holding sensor that detects whether the lid is held by the lid attaching/detaching plate, the lid holding sensor including a pressure sensor that measures an atmospheric pressure within the cassette;

a gas supply that supplies a gas into the cassette disposed on the stage; and a controller that determines a presence/absence of an abnormality related to an attachment/detachment of the lid based on a measurement result of the pressure sensor during supply of the gas into the cassette by the gas supply or after the supply of the gas into the cassette by the gas supply.

* * * * *